United States Patent [19]
Kono et al.

[11] Patent Number: 5,847,595
[45] Date of Patent: Dec. 8, 1998

[54] SEMICONDUCTOR DEVICE HAVING CONTROLLABLE INTERNAL POTENTIAL GENERATING CIRCUIT

[75] Inventors: Takashi Kono; Tsukasa Ooishi; Hideto Hidaka, all of Hyogo, Japan

[73] Assignee: Mitsubishi Denki Kabushiki Kaisha, Tokyo, Japan

[21] Appl. No.: 757,861

[22] Filed: Nov. 27, 1996

[30] Foreign Application Priority Data

Nov. 29, 1995 [JP] Japan ..................... 7-335862

[51] Int. Cl.⁶ ........................... H03K 3/01
[52] U.S. Cl. ........................... 327/530; 327/534
[58] Field of Search ................... 327/534, 535, 327/536, 530; 333/57; 323/312, 315

[56] References Cited

U.S. PATENT DOCUMENTS 5,400,290   3/1995   Suma et al. ..................... 365/226
5,640,118   6/1997   Drouot ........................... 327/536

*Primary Examiner*—Timothy P. Callahan
*Assistant Examiner*—Jeffrey Zweizig
*Attorney, Agent, or Firm*—McDermott, Will & Emery

[57] ABSTRACT

A semiconductor memory device includes a mode detection circuit for generating a mode detection signal in response to external input signals /RAS, /CAS and /WE, an internal potential generating circuit for generating and supplying to an output node an internal potential, in response to an activated potential control signal, and an internal potential control circuit for activating a potential control signal when a potential at the output node has not yet reached a predetermined potential in a case where mode detection signal indicates a mode other than the test mode, and for activating the potential control signal when the potential at the output node has not yet reached an externally supplied external reference potential in a case where the mode detection signal indicates the test mode. When external input signals are applied at a predetermined timing, a mode detection signal indicating the test mode is generated, and when the potential at the output node of the internal potential generating circuit has not yet reached the external reference potential, an internal potential is generated and supplied to the output node. Therefore, the internal potential can be controlled in accordance with the external reference potential.

4 Claims, 19 Drawing Sheets

SEMICONDUCTOR DEVICE HAVING CONTROLLABLE INTERNAL POTENTIAL GENERATING CIRCUIT

BACKGROUND OF THE INVENTION

1. Field of the Invention

The present invention relates to a semiconductor device, and more specifically, to a semiconductor device in which a prescribed characteristic test is performed.

2. Description of the Background Art

Recently, a semiconductor device is provided with an internal potential generating circuit for internally generating a potential other than a power supply potential and a ground potential which are externally supplied, so that performance of the device is improved. Accordingly, when characteristic of the semiconductor device is tested and evaluated, influence of the internal potential generating circuit on other circuitry and the performance of the internal potential generating circuit itself have come to be an important problem.

FIG. 26 is a block diagram showing a monitor circuit of a semiconductor device which outputs a potential generated in the semiconductor device in response to an external signal for monitoring, disclosed in U.S. Pat. No. 5,400,290. Referring to FIG. 26, the semiconductor device includes a state detecting circuit 1 for outputting an output buffer activating signal IVE in response to states of external input signals /RAS, /CAS and /WE, and an output buffer 2 responsive to the output buffer activating signal IVE for outputting an internal power supply potential IVcc generated by an internal potential generating circuit (not shown), to a data input/output pin PD. State detecting circuit 1 includes a signature mode signal generating circuit 3 and a second timing detection circuit 4. Signature mode signal generating circuit 3 includes a first timing detection circuit 5 and a high potential detection circuit 6.

High potential detection circuit 6 applies, when it detects a potential higher than a generally applied H (logic high) level, a high potential detection signal SHVcc to the first timing detection circuit 5. The first timing detection circuit 5 applies, when the high potential detection signal SHVcc is applied and externally applied input signals /RAS, /CAS and /WE are applied at a prescribed timing, a signature mode signal SIGE to the second timing detection circuit 4. Signature mode signal SIGE indicates that the semiconductor device is set to a mode for monitoring an internal power supply potential Ivcc. The second timing detection circuit 4 applies, when externally applied external input signals /RAS, /CAS and /WE are applied at a prescribed timing, an output buffer activating signal IVE to output buffer 2, in response to the signature mode signal SIGE.

The structure of the high potential detection circuit 6 will be described. Referring to FIG. 27, high potential detection circuit 6 includes N channel MOS transistors Q11 to Q1n, and an N channel MOS transistor Q4. Each of the transistors Q11 to Q1n is diode connected (with its gate connected to the drain). Transistors Q11 to Q1n are connected between an address pin PAi and an output node for the high potential detection signal SHVcc, in series in forward direction from the address pin Pai toward the output node of the high potential detection signal SHVcc. Transistor Q4 is connected between the output node of the high potential detection signal SHVcc and a ground potential node 1a, and receives at its gate the internal power supply potential Ivcc.

Structure of the output buffer 2 will be described. Referring to FIG. 28, output buffer 2 includes inverters IV11 to IV16, N channel MOS transistors Q5 and Q6, and a capacitor C1. Inverters IV11 to IV16 are connected in series between an input node which receives the output buffer activating signal IVE from state detection circuit 1, and one node N2 of capacitor C1. Transistor Q5 is connected between an input node and the gate of transistor Q6, and has its gate connected to an internal power supply potential node 1b to which the internal power supply potential Ivcc is supplied. Transistor Q6 is connected between data input/output pin PD and the internal power supply potential node 1b. Capacitor C1 is connected between a delay circuit 7 and gate of transistor Q6, and boosts the gate potential of transistor Q6 when output buffer 2 is activated.

The operation of the monitor circuit structured as above will be described in the following. At the signature mode set timing shown in FIG. 29, row address strobe signal /RAS, column address strobe signal /CAS and write enable signal /WE are applied at a WE, CAS before RAS timing (hereinafter referred to as WCBR). The WCBR timing is commonly used when the DRAM (Dynamic Random Access Memory) enters a test mode. When an address signal Ai at the level of Vcc+nVth, which is higher than H level (Vcc) of the input signal, is applied to the address pin PAi at the same time, high potential detection circuit 6 detects the high potential, and high potential detection signal SHVcc changes to the H level. When the first timing detection circuit 5 detects the WCBR timing and the high potential detection signal SHVcc at the H level, the signature mode signal SIGE changes to the H level, and the semiconductor device is set to a mode for monitoring the internal power supply potential Ivcc.

Timing for monitoring the internal power supply potential will be described. Referring to the timing chart of FIG. 30, row address strobe signal /RAS at the H level is applied while the signature mode is being set. Write enable signal /WE at the L (logic low) level is applied and thereafter, column address strobe signal /CAS at the L level is applied. At this time, the second timing detection circuit 4 causes output buffer activating signal IVE to change to the H level. When output buffer activating signal IVE changes to the H level, the potential at node N3 in output buffer 2 becomes lower by the threshold voltage of transistor Q5 than the H level of the output buffer activating signal IVE. Thereafter, the change of the output buffer activating signal IVE to the H level is delayed by delay circuit 7 and transmitted to node N2. In response to the transmitted signal, the potential at node N3 is boosted by coupling of capacitor C1. When the potential at node N3 is boosted, transistor Q6 turns on and the internal power supply potential IVcc is output to data input/output pin PD, so that the internal power supply potential Ivcc can be directly monitored from the outside.

In the conventional semiconductor device structured as above, the potential generated internally in a prescribed period can be monitored. However, even when the monitored internally generated potential is not satisfactory, it is necessary to change the external power supply potential Vcc in order to immediately change the internally generated potential. Therefore, it is difficult to analyze causes of defective characteristics which result from various internally generated potentials.

In order to change the internally generated potential with the external power supplied potential Vcc being kept constant to perform experiments, the semiconductor device must be processed by FIB or laser. The internally generated potential can be changed as desired in a semiconductor device which is incorporated in a ceramic package for evaluation. However, a semiconductor device sealed by a mold resin cannot be processed by FIB or laser. Therefore, experiment for changing the internally generated potential based on a constant external power supply potential is not possible.

SUMMARY OF THE INVENTION

An object of the present invention is to provide a semiconductor device in which an internal potential, especially a substrate potential or a boosted potential, can be externally controlled in a prescribed mode.

Another object of the present invention is to provide a semiconductor device allowing control of an internal potential without FIB or laser processing, and without necessitating provision of a new external pin even in a semiconductor device sealed by a mold resin.

According to an aspect of the present invention, the semiconductor device includes a generating circuit for generating an internal potential, and a control circuit for controlling the internal potential in response to an externally supplied external reference potential. Preferably, the semiconductor device further includes an activating means for activating the control circuit in response to an external input signal.

According to another aspect of the present invention, the semiconductor device includes a mode detection circuit, an output node, an internal potential generating circuit and an internal potential control circuit. The mode detection circuit generates a mode detection signal selectively indicating first and second modes in response to an external input signal. The internal potential generating circuit generates and supplies to an output node, an internal potential, in response to an activated potential control signal, and stops generation of the internal potential in response to an inactivated potential control signal. The internal potential control circuit activates the potential control signal when the potential at the output node has not reached a predetermined internal reference potential in a first case in which mode detection signal indicates the first mode, and activates/inactivates the potential control signal in response to an externally supplied external reference potential in a second case in which the mode detection signal indicates the second mode.

Therefore, an advantage of the present invention is that the internal potential can be generated and controlled by the internal potential generating circuit in response to an externally supplied external reference potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
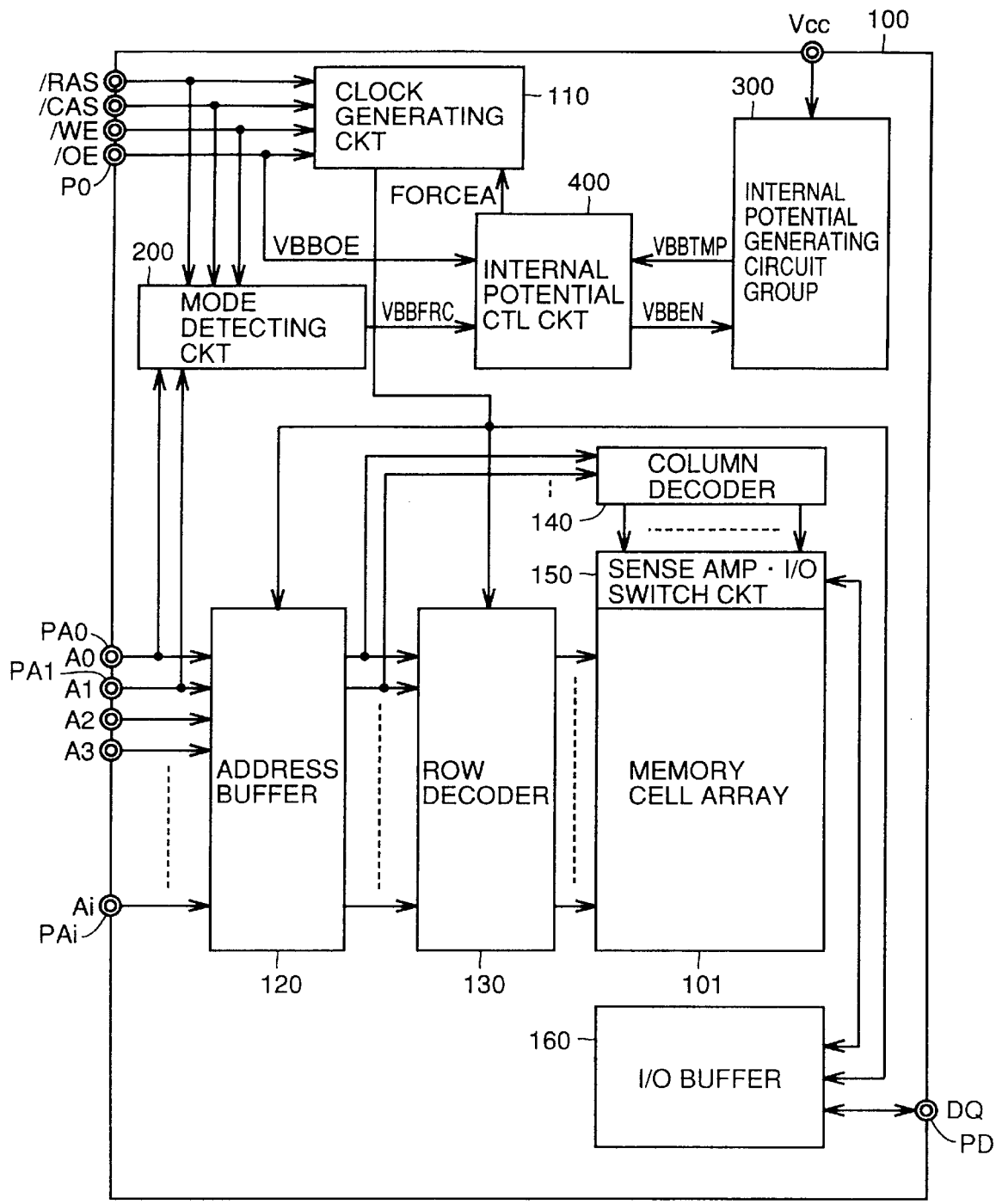
FIG. 1 is a block diagram showing an overall structure of a DRAM in accordance with an embodiment of the present invention.

A DRAM in accordance with the embodiment of the present invention will be described. In the DRAM, a substrate potential (hereinafter referred to as Vbb) can be controlled in response to an externally supplied external reference potential in a test mode (hereinafter referred to as VbbFORCE mode). Referring to FIG. 1, the DRAM 100 in accordance with the present embodiment includes a clock generating circuit 110, an address buffer 120, a row decoder 130, a column decoder 140, a sense amplifier•I/O switch circuit 150 and an input/output buffer 160. Clock generating circuit 110 receives externally applied external input signals, more specifically, row address strobe signal /RAS, column address strobe signal /CAS, write enable signal /WE and output enable signal /OE and generates a clock signal for controlling internal operation. Address buffer 120 receives external address signals Ai (i=0, 1, 2, . . . ) and outputs row address signals RAi, /RAi and column address signals CAi, /CAi for the internal circuitry. Row decoder 130 selects a word line in memory cell array 101 in response to row address signals RAi, /RAi from address buffer 120. Column decoder 140 selects a sense amplifier•I/O circuit 150 in response to column address signals Cai, /Cai from address buffer 120. The sense amplifier amplifies a potential read from the memory cell to the bit lines. I/O switch circuit transfers the data signal read from the memory cell to the bit lines to a data line. Input/output buffer 160 receives a write or read instruction from clock generating circuit 110, transmits data signal DQ externally applied to data input/output pin PD to sense amplifier•I/O switch circuit 150 through a data line for writing, and outputs data read from the memory cell amplified by the sense amplifier and transmitted through I/O switch circuit and a data line to data input/output pin PD for reading.

DRAM 100 further includes a mode detection circuit 200, an internal potential generating circuit group 300, and an internal potential control circuit 400. Mode detection circuit 200 generates a mode detection signal VBBFRC selectively indicating the VbbFORCE mode and other mode (for example, normal mode, other test mode) in response to the external input signals /RAS, /CAS, /WE and /OE. Internal potential generating circuit group 300 receives external power supply potential Vcc and ground potential Vss and generates an internal potential to be used in the internal circuitry. Internal potential generating circuit group 300 includes a substrate potential generating circuit (hereinafter referred to as Vbb generating circuit) and a boosted potential generating circuit (hereinafter referred to as Vpp generating circuit). Internal potential control circuit 400 receives the mode detection signal VBBFRC from mode detection circuit 200, activates the potential control signal VBBEN when an output potential VBBTMP generated in internal potential generating circuit group 300 has not yet reached the external reference potential VBBOE applied from output enable pin PO in VbbFORCE mode, and activates the potential control signal VBBEN when output potential VVBTMP has not yet reached a predetermined internal reference potential in a mode other than VbbFORCE mode.

Figure 2:
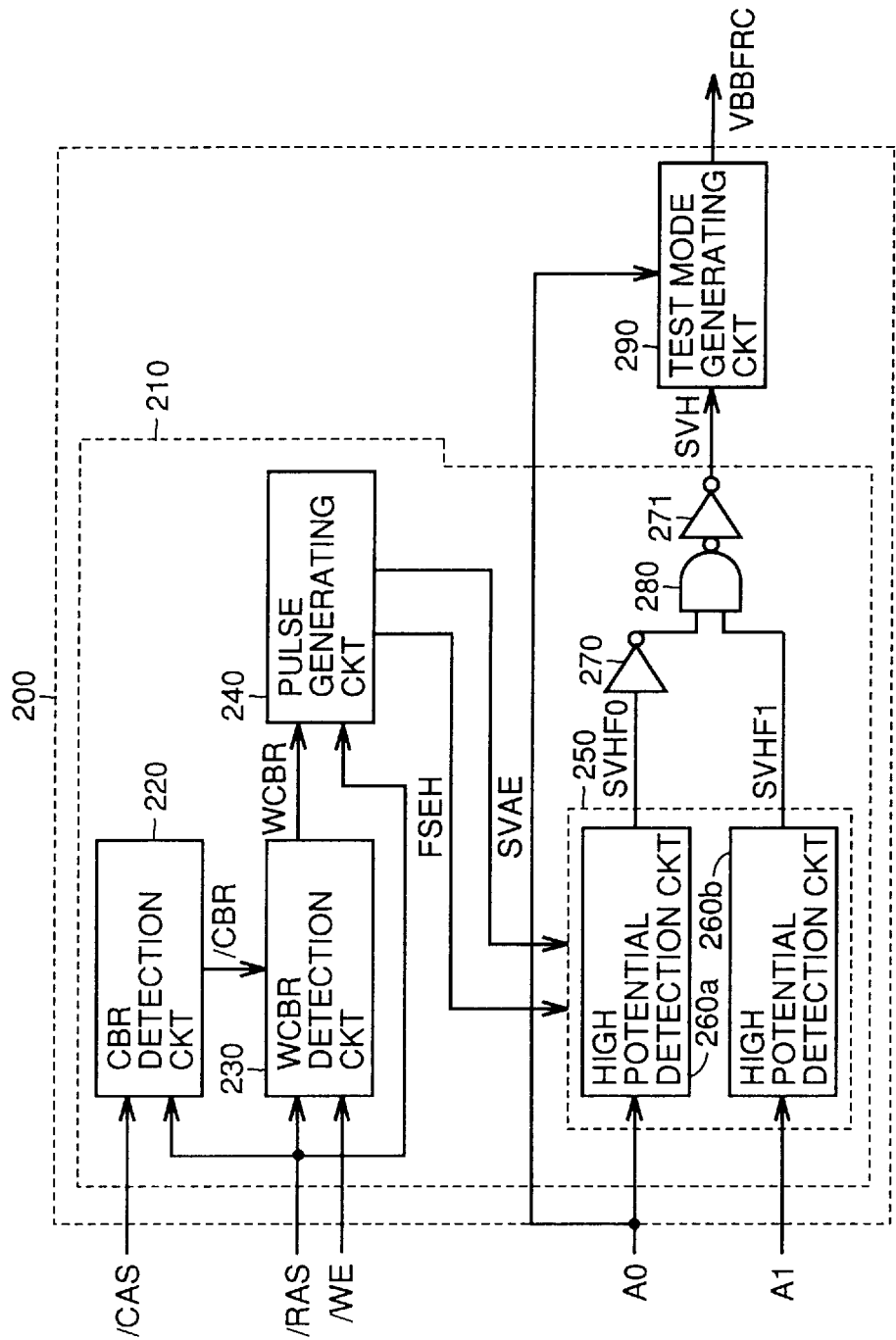
FIG. 2 is a block diagram showing a structure of a mode detection circuit shown in FIG. 1.

Referring to FIG. 2, mode detection circuit 200 includes a test mode entry detection circuit 210 and a test mode generating circuit 290. Test mode entry detection circuit 210 includes a CBR detection circuit 220, a WCBR detection circuit 230, a pulse generating circuit 240, a high potential detection circuit group 250, inverters 270 and 271, and an NAND circuit 280. CBR detection circuit 220 detects column address strobe signal /CAS falling before row address strobe signal /RAS, and generates detection signal /CBR. WCBR detection circuit 230 receives detection signal /CBR from CBR detection circuit 220, detects fall of write enable signal /WE before row address strobe signal /RAS and column address strobe signal /CAS, and generates detection signal WCBR. Pulse generating circuit 240 receives detection signal WCBR, and generates pulse signals FSEH and SVAE for activating high potential detection circuit group 250. High potential detection circuit group 250 detects high potential SVcc applied from address pins PA0 and PA1.

High potential detection circuit group 250 includes high potential detection circuits 260a and 260b corresponding to two address pins PA0 and PA1. High potential detection circuits 260a and 260b are identical in structure. High potential detection circuits 260a and 260b activated in response to pulse signals FSEH and SVAE from pulse generating circuit 240 detect, when a potential Svcc higher than the power supply potential Vcc is applied as external address signals A0 and A1, the applied high potential SVcc, and causes high potential detection signals SVHF0 and SVHF1 to rise to the H level. When the high potential detection signal SVHF0 is at the L level and high potential detection signal SVHF1 is at the H level, test mode reception signal SVH changes to the H level. When an H level (power supply potential Vcc) is applied as external address signal A0 while test mode reception signal SVH is at the H level, test mode generating circuit 290 selects a test mode indicating VbbFORCE mode among various test modes, and outputs a mode detection signal VBBFRC at the H level, indicating the VbbFORCE mode.

Figure 3:
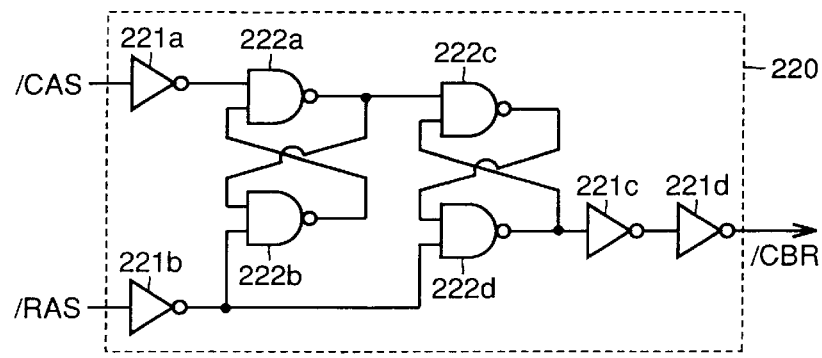
FIG. 3 is a circuit diagram showing a structure of a CBR detection circuit shown in FIG. 2.
Figure 4:
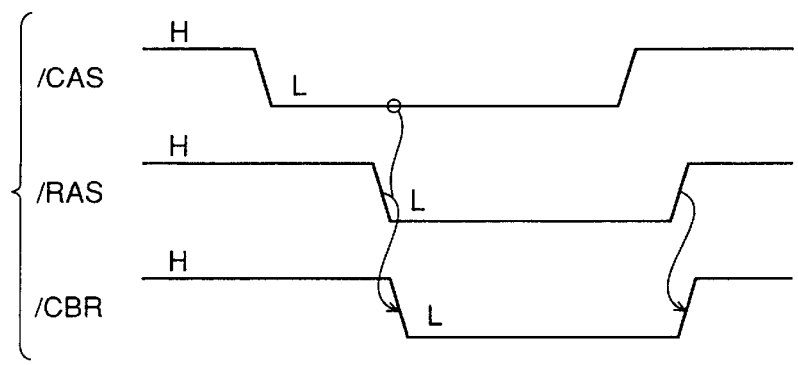
FIG. 4 is a timing chart showing the operation of the CBR detection circuit of FIG. 3.

CBR detection circuit 220 of FIG. 2 includes, as shown in FIG. 3, inverters 221a, 221b, 221c and 221d, and NAND circuits 2221, 222b, 222c and 222d. Referring to the timing chart of FIG. 4, when column address strobe signal /CAS changes from the H level to the L level while the row address strobe signal /RAS is at the H level, and thereafter row address strobe signal /RAS changes from the H level to the L level, detection signal /CBR changes from H to L level. Thereafter, when row address strobe signal /RAS changes from L level back to H level, detection signal /CBR changes from the L level to the H level.

Figure 5:
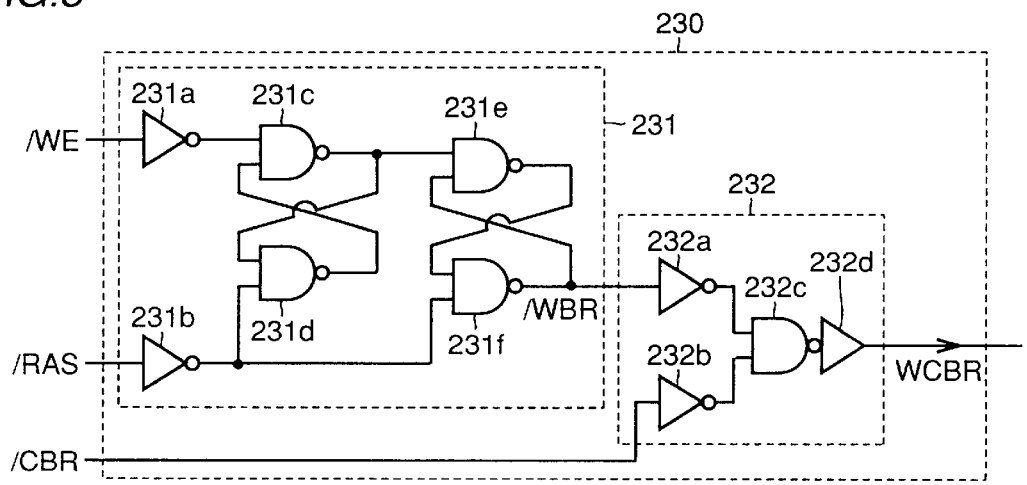
FIG. 5 is a circuit diagram showing a structure of WCBR detection circuit shown in FIG. 2.

WCBR detection circuit 230 shown in FIG. 2 includes, as shown in FIG. 5, a /WBR detection circuit 231 and a logic circuit 232. /WBR detection circuit 231 includes inverters 231a and 231b, and NAND circuits 231c, 231d, 231e and 231f. Logic circuit 232 includes inverters 232a, 232b, 232d and an NAND circuit 232c. /WBR detection circuit 231 detects fall of write enable signal /WE before row address strobe signal /RAS, and outputs detection signals /WBR. Logic circuit 232 outputs, when detection signals /CBR and /WBR are both at the L level, that is, when column address strobe signal /CAS falls before row address strobe signal /RAS and write enable signal /WE falls before row address strobe signal /RAS, a detection signal WCBR at the H level.

Figure 6:
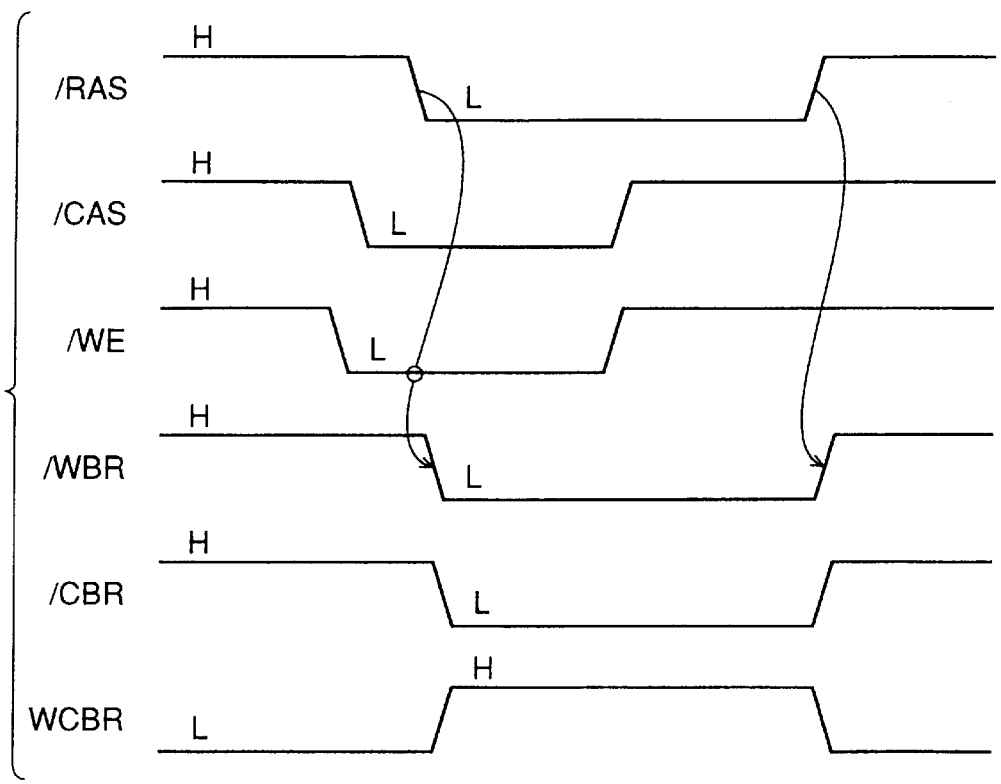
FIG. 6 is a timing chart showing the operation of the WCBR detection circuit of FIG. 5.

Referring to the timing chart of FIG. 6, when write enable signal /WE changes from the H level to the L level while the row address strobe signal /RAS is at the H level and thereafter row address strobe signal /RAS changes from the H level to the L level, detection signal /WBR changes from the H level to the L level. Similarly, when column address strobe signal /CAS changes from the H to the L level while the row address strobe signal /RAS is at the H level and row address strobe signal /RAS changes from the H level to the L level as shown in the timing chart of FIG. 4, detection signal /CBR changes from the H level to the L level. When detection signals /WBR and /CBR both change to the L level, the WCBR from logic circuit 232 changes from the L level to the H level. When row address strobe signal /RAS changes from the L level to the H level thereafter, detection signals /WBR and /CBR both change from the L level to the H level, and detection signal WCBR changes from the H level to the L level.

Figure 7:
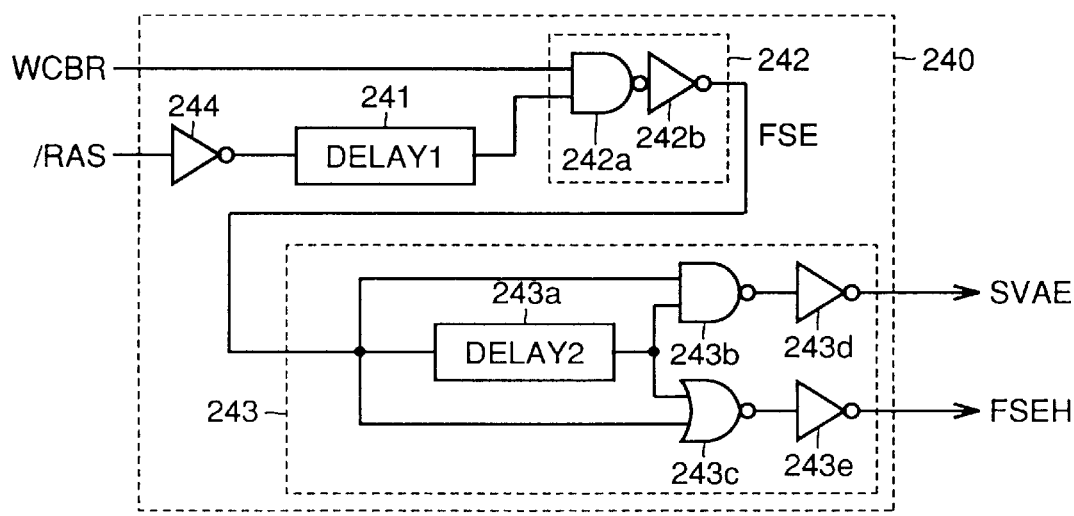
FIG. 7 is a block diagram showing a structure of a pulse generating circuit shown in FIG. 2.

Pulse generating circuit 240 shown in FIG. 2 includes, as shown in FIG. 7, an inverter 244, a delay circuit 241, a logic circuit 242 and a pulse waveform generating circuit 243. Delay circuit 241 delays an inverted signal of row address strobe signal /RAS. Logic circuit 242 includes an NAND circuit 242a and an inverter 242b, and generates an output signal FSE in response to detection signal WCBR and to an output signal from delay circuit 241. Output signal FSE rises at the rise of detection signal WCBR, and falls after a period determined by delay circuit 241 from the rise of row address strobe signal /RAS. Pulse waveform generating circuit 243 includes a delay circuit 243a, an NAND circuit 243b, an NOR circuit 243c and inverters 243b and 243e, and generates pulse signals SVAE and FSEH in response to an output signal FSE from logic circuit 242. Pulse signal SVAE rises delayed from the rise of output signal FSE, and falls quickly at the fall of output signal FSE. Pulse signal FSEH rises quickly at the rise of output signal FSE, and falls delayed from the fall of output signal FSE.

Figure 8:
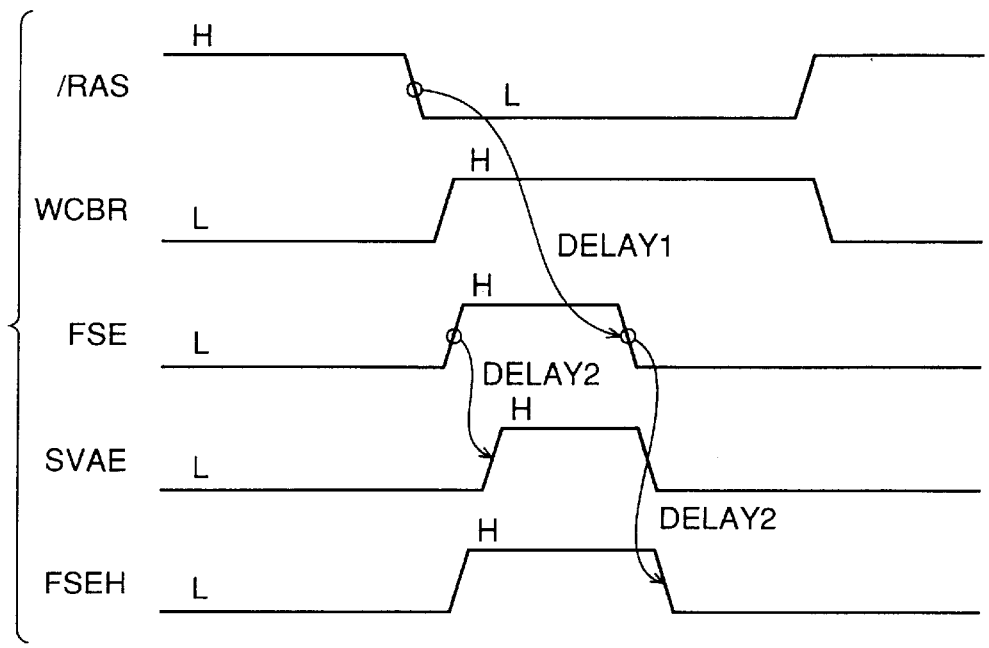
FIG. 8 is a timing chart showing the operation of the pulse generating circuit of FIG. 7.

Referring to the timing chart of FIG. 8, when detection signal WCBR from WCBR detection circuit 230 of FIG. 5 changes from the L level to the H level, output signal FSE changes from the L level to the H level. In response, first, pulse signal FSEH changes from the L level to the H level, and thereafter pulse signal SVAE changes from the L level to the H level. When the change in row address strobe signal /RAS from the H to the L level is transmitted through delay circuit 241 to logic circuit 242, output signal FSE changes from the H level to the L level. In response, first, pulse signal SVAE changes from the H to L level, and thereafter, pulse signal FSEH changes from H to L level.

Figure 9:
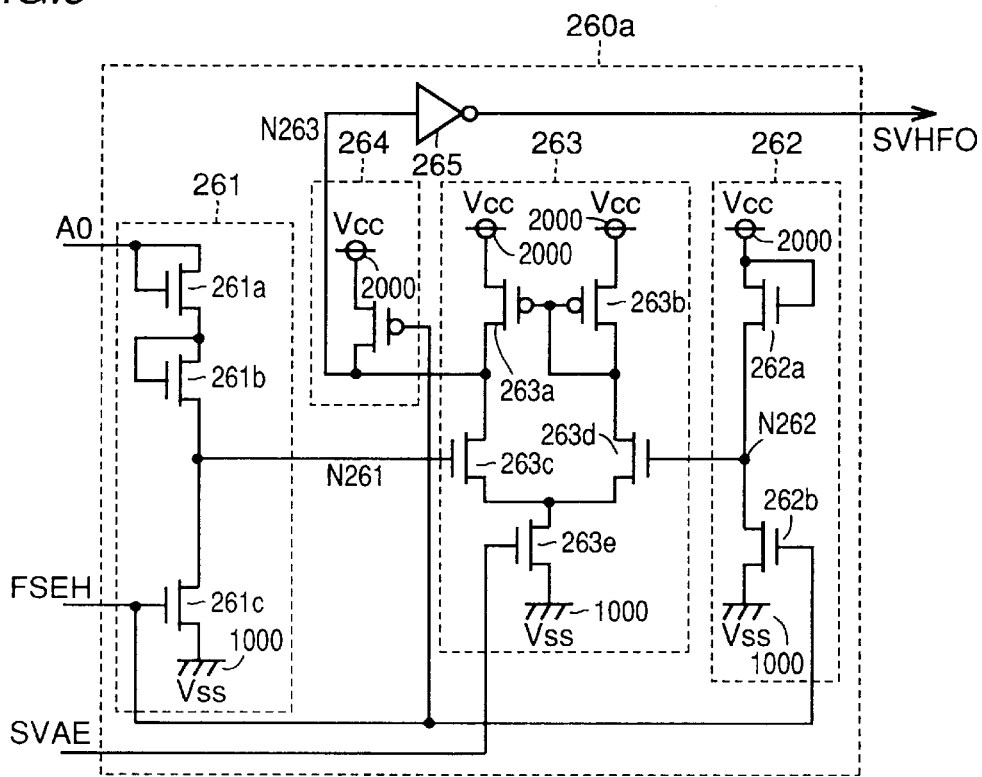
FIG. 9 is a circuit diagram showing a structure of one high potential detection circuit shown in FIG. 2.

High potential detection circuit 260a of FIG. 2 includes, as shown in FIG. 9, a voltage dividing circuit 261, a reference voltage dividing circuit 262, a comparing circuit 263, a P channel MOS transistor 264 and an inverter 265. High potential detection circuit 260b of FIG. 2 has similar structure as circuit 260a.

Voltage dividing circuit 261 includes N channel MOS transistors 261a, 261b and 261c connected in series between address pin PA0 and ground potential node 1000. Transistor 261c is rendered conductive in response to pulse signal FSEH at the H level, and it has sufficiently high conduction resistance. In voltage dividing circuit 261, when a high potential SVcc is applied to address pin PA0, a potential of SVcc−2Vth appears at output node N261. Reference voltage dividing circuit 262 includes N channel MOS transistors 262a and 262b connected in series between power supply potential node 2000 and ground potential node 1000. Transistor 262b is rendered conductive in response to pulse signal FSEH at the H level, and it has sufficiently high conduction resistance. In reference voltage dividing circuit 262, a potential of Vcc−Vth appears at output node N262.

Comparing circuit 263 is constituted by a current mirror differential amplifying circuit. More specifically, it includes two P channel MOS transistors 262a, 263b commonly connected to a power supply potential node 2000 and connected parallel to each other; an N channel MOS transistor 263c connected in series with transistor 263a and having its gate connected to an output node N261 of voltage dividing circuit 261; an N channel MOS transistor 263d connected in series with transistor 263b and having its gate connected to output node N262 of reference voltage dividing circuit 262; and an N channel MOS transistor 263e which turns on in response to the pulse signal SVAE at the H level. When transistor 263e turns on, current mirror differential amplifying circuit 263 is activated. P channel MOS transistor 264 is connected between output node N263 of comparing circuit 263 and power supply potential node 2000, and it turns on in response to the pulse signal FSEH at the L level. When transistor 264 turns on, the potential at output node N263 is pulled up to be equal to power supply potential Vcc. Inverter 265 inverts an output signal from comparing circuit 263 and outputs a high potential detection signal SVHF0.

Figure 10:
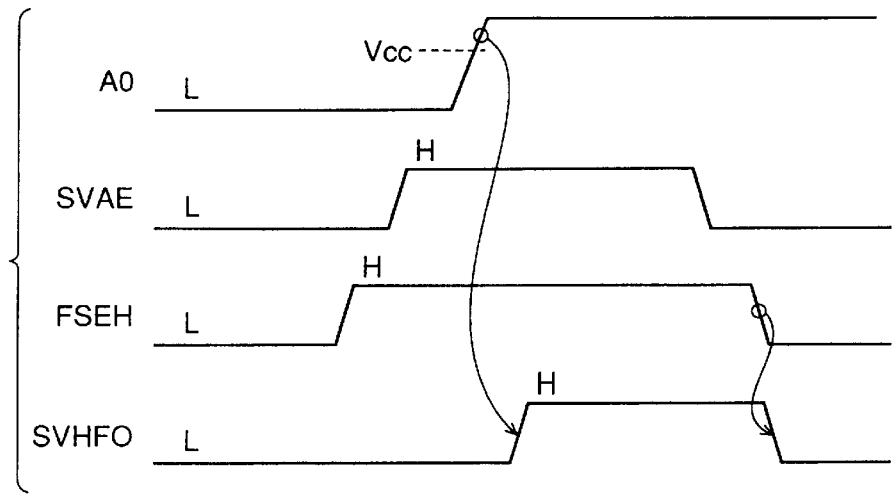
FIG. 10 is a timing chart showing the operation of the high potential detection circuit of FIG. 9.

Referring to the timing chart of FIG. 10, when the pulse signal FSEH from pulse generating circuit 240 of FIG. 2 changes from the L level to the H level, voltage dividing circuit 261 and reference voltage dividing circuit 262 are activated, and the potentials divided thereby appear at output nodes N261 and N262, respectively. Thereafter, when the pulse signal SVAE from pulse generating circuit 240 changes from the H level to the L level, comparing circuit 263 is activated. When high potential SVcc is applied from address pin PA1, the potential at output node N261 attains to SVcc−2Vth. Comparing circuit 263 compares the potential SVcc−2Vth at output node N261 with the potential Vcc−Vth at output node N262 of reference voltage dividing circuit 262. When the potential SVcc−2Vth of output node N261 becomes higher than the potential Vcc−Vth of output node N262, high potential detection signal SVHF changes from the L level to the H level, whereby the fact that a high potential SVcc (>Vcc+2Vth) is applied from address pin PA0 is detected. Thereafter, when the pulse signal FSEH changes from the H to L level or when application of high voltage SVcc (>Vcc+2Vth) from address pin PA0 is stopped, high potential detection signal SVHF0 changes from H to L level.

Figure 11:
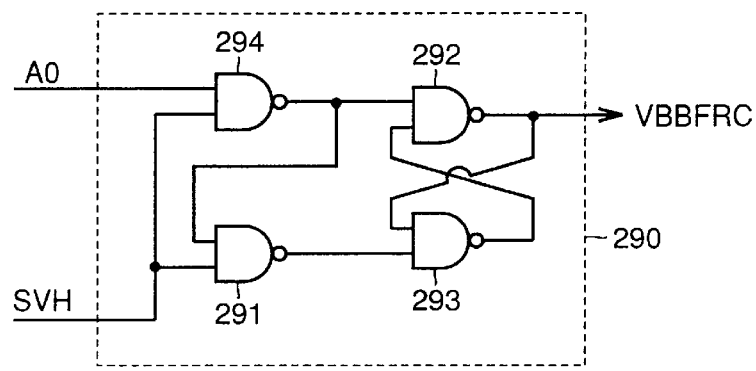
FIG. 11 is a circuit diagram showing a structure of a test mode generating circuit shown in FIG. 2.
Figure 12:
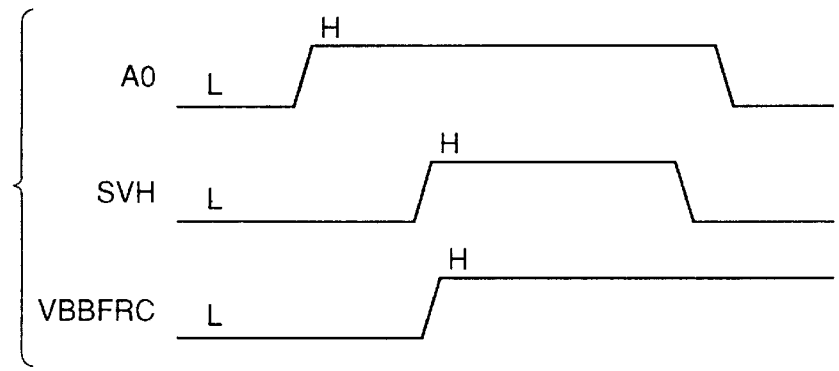
FIG. 12 is a timing chart showing the operation of the test mode generating circuit of FIG. 11.

Test mode generating circuit 290 of FIG. 2 includes NAND circuits 291 to 294, as shown in FIG. 11. Referring to the timing chart of FIG. 12, while the test mode reception signal SVH from test mode entry detection circuit 210 of FIG. 2 is at the H level indicating that it is a test mode reception period, an address signal A0 at the H level is applied from address pin PA0, and mode detection signal VBBFRC at the H level indicating the VBBFORCE mode is output.

Figure 13:
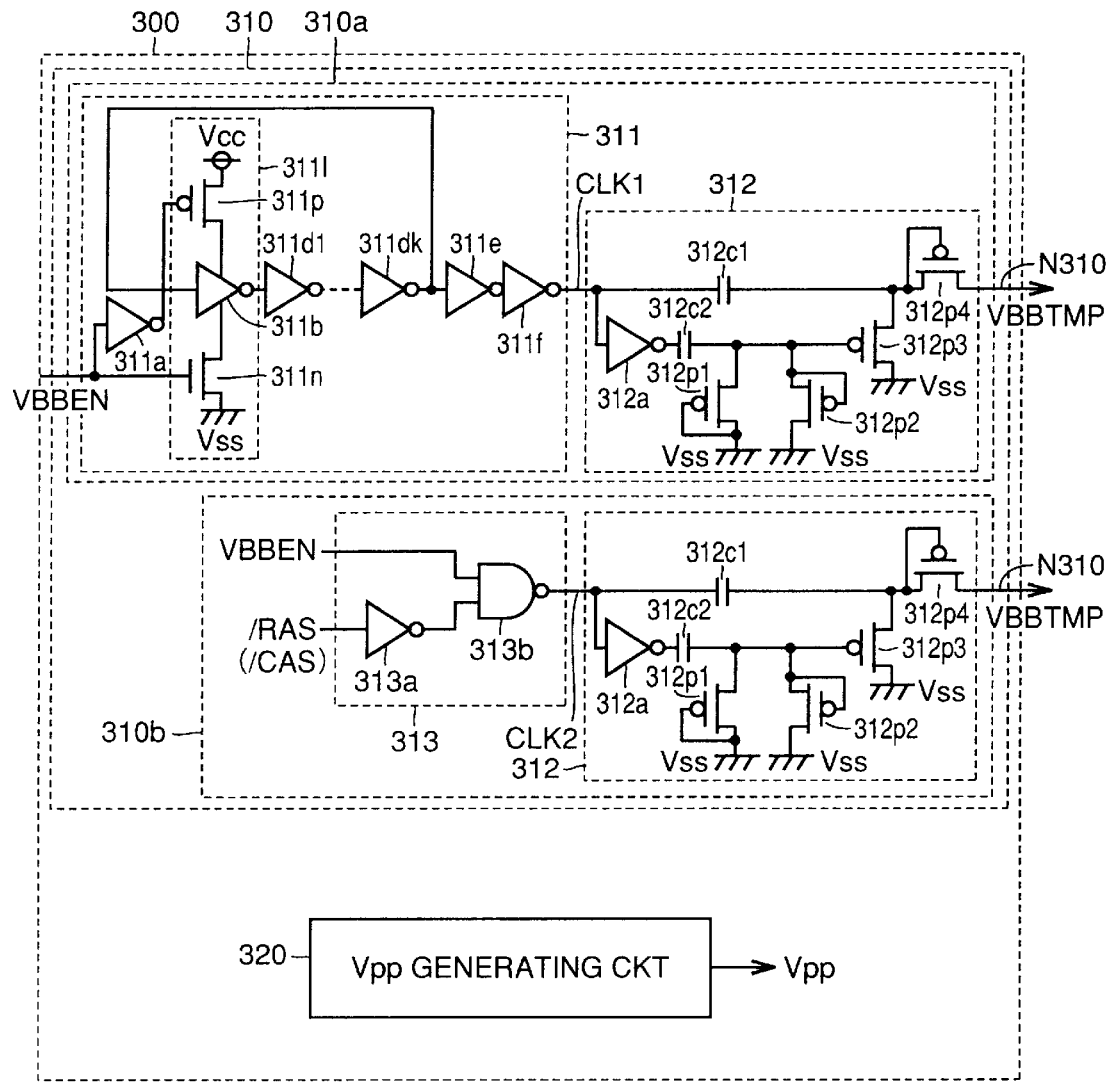
FIG. 13 is a block diagram showing a structure of an internal potential generating circuit group of FIG. 1.

Internal potential generating circuit group 300 of FIG. 1 includes, as shown in FIG. 13, Vbb generating circuit group 310 for generating the potential Vbb, and a Vpp circuit 320 for generating the potential Vpp. Vbb generating circuit group 310 includes a first Vbb generating circuit 310a and a second Vbb generating circuit 310b.

The first Vbb generating circuit 310a includes a ring oscillator 311 and a charge pump circuit 312. Ring oscillator 311 includes an inverter 311a for inverting potential control signal VBBEN, a clocked inverter 311I which is controlled in response to potential control signal VBBEN, k inverters 311d1 to 311dk connected in series and inverters 311e and 311f for driving. Clocked inverter 311I includes a P channel MOS transistor 311p, an N channel MOS transistor 311n and an inverter 311b. Inverters 311I and 311d1 to 311dk are connected in a ring. Ring oscillator 311 is activated in response to the potential control signal VBBEN at the H level, and generates a clock signal CLK1. Charge pump circuit 312 includes an inverter 312a, capacitors 312c1 and 312c2, and P channel MOS transistors 312p1, 312p2, 3123 and 312p4. Charge pump circuit 312 receives the clock signal CLK1 from ring oscillator 311, and generates Vbb potential VBBTMP.

The second Vbb generating circuit 310b includes a clock circuit 313 which receives potential control signal VBBEN and address strobe signal /RAS or /CAS and generates a clock signal CLK2, and a charge pump circuit 312 receiving the clock signal CLK2 from clock circuit 313 and generating Vbb potential VBBTMP. Clock circuit 313 includes an inverter 313a for inverting the address strobe signal /RAS or /CAS, and an NAND circuit 313b receiving potential control signal VBBEN and an output signal from inverter 313a. Charge pump circuit 312 in the second Vbb generating circuit 310b has identical structure as the charge pump circuit in the first Vbb generating circuit 310a described above.

Figure 14:
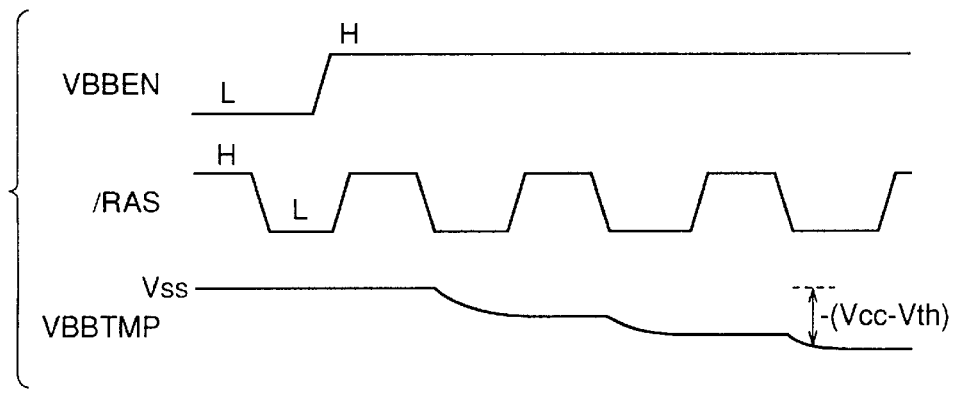
FIG. 14 is a timing chart showing the operation of Vbb generating circuit shown in FIG. 13.

Referring to the timing chart of FIG. 14, when the second Vbb generating circuit 310b of FIG. 13 is activated in response to the potential control signal VBBEN at the H level, clock signal CLK2 is oscillated in synchronization with row address strobe signal /RAS, and charge pump circuit 312 supplies the potential Vbb to output node N310. Consequently, the Vbb potential VBBTMP lowers. The limit potential which can be supplied Vbb generating circuits 310a and 310b is -(Vcc-Vth). Here, "supply potential" means to enlarge absolute value of the generated potential. Therefore, in Vbb generating circuits 310a and 310b, supply of potential Vbb means lowering the potential Vbb. In Vpp generating circuit 320, to supply the potential Vpp means that the potential Vpp is made higher.

Figure 15:
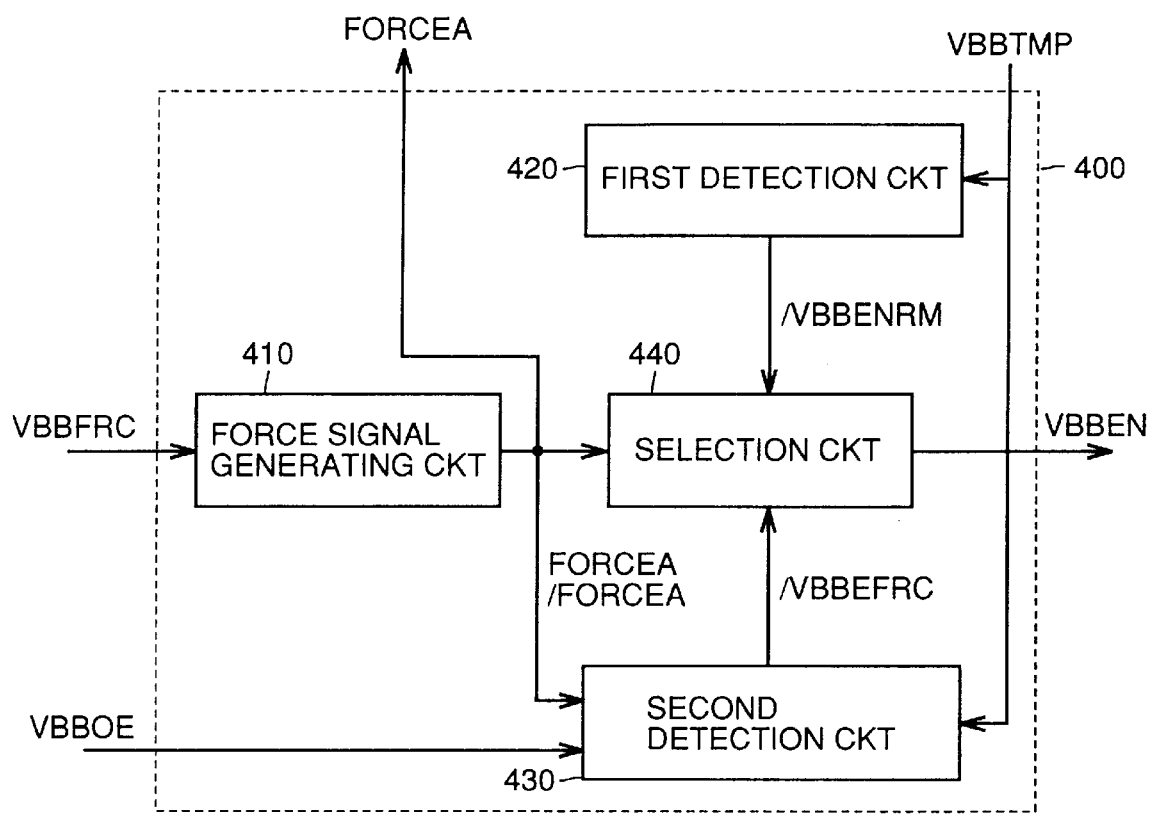
FIG. 15 is a block diagram showing a structure of an internal potential control circuit shown in FIG. 1.

Internal potential control circuit 400 of FIG. 1 includes, as shown in FIG. 15, FORCE signal generating circuit 410, a first detection circuit 420, a second detection circuit 430 and a selecting circuit 440. FORCE signal generating circuit 410 generates selection control signals FORCEA and /FORCEA in response to mode detection signal VBBFRC from mode detection circuit 200 of FIG. 1. When mode detection signal VBBFRC indicates the VbbFORCE mode, that is, when it is at the H level, FORCE signal generating circuit 410 activates the second detection circuit 430, and controls selecting circuit 440 such that it selects the detection signal VBBEFRC from the second detection circuit 430 as the potential control signal VBBEN. The first detection circuit 420 detects whether the Vbb potential VBBTMP at output node N310 of Vbb generating circuits 310a and 310b has reached a predetermined internal reference potential. The second detection circuit 430 detects whether the Vbb potential VBBTMP has reached an external reference potential VBBOE supplied from an output enable pin PO, in response to selection control signals FORCEA and /FORCEA from FORCE signal generating circuit 410. Selecting circuit 440 receives selection control signals FORCEA and /FORCEA from FORCE signal generating circuit 410, and when selection control signal FORCEA is at the H level, that is, in the VbbFORCE mode, outputs the detection signal /VBBEFRC from the second detection circuit 430 as potential control signal VBBEN, and when selection control signal FORCEA is at the L level, that is, other than the VbbFORCE mode, outputs the detection signal /VBBENRM from the first detection circuit 420 as potential control signal VBBEN.

Figure 16:
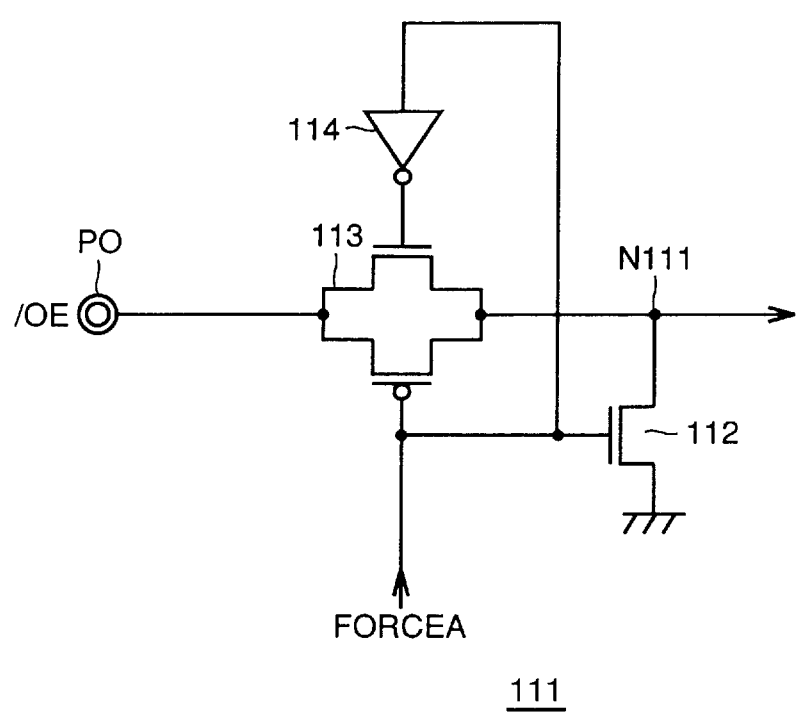
FIG. 16 is a circuit diagram showing a structure of an output enable signal activating circuit in a clock generating circuit shown in FIG. 1.
Figure 17:
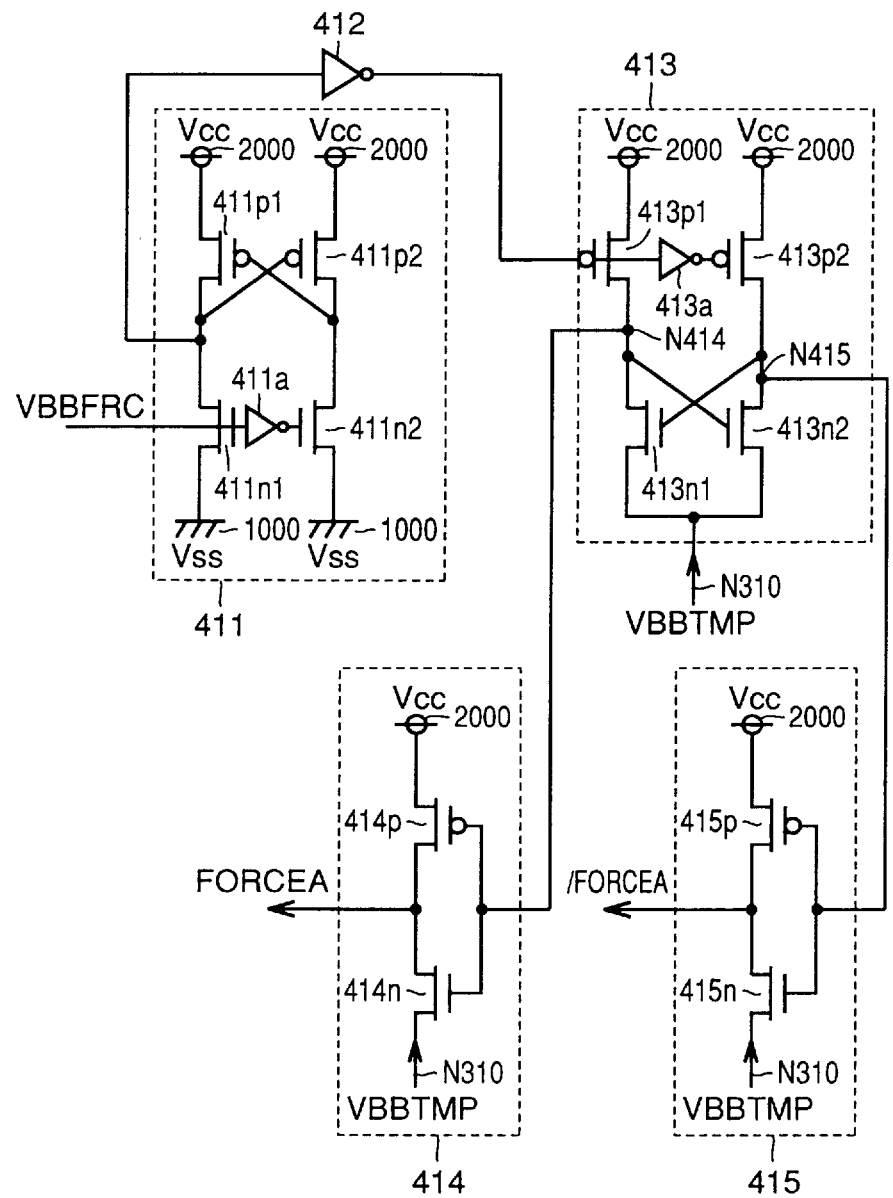
FIG. 17 is a circuit diagram showing a structure of an FORCE signal generating circuit shown in FIG. 15.

The FORCE signal generating circuit 410 of FIG. 15 includes, as shown in FIG. 16, a level shift circuit 411 receiving mode detection signal VBBFRC, an inverter 412 inverting an output signal from level shift circuit 411, a level shift circuit 413 receiving an output signal from inverter 412, an inverter 414 for inverting a signal appearing at a first output node N414 of level shift circuit 413 for outputting the selection control signal FORCEA, and an inverter 415 for inverting a signal appearing at a second output node N415 of level shift circuit 413 for outputting selection control signal /FORCEA. Level shift circuit 411 includes an inverter 411a, P channel MOS transistors 411p1 and 411p2, and N channel MOS transistors 411n1 and 411n2. Level shift circuit 413 includes an inverter 413a, p channel MOS transistors 413p1 and 413p2 and N channel MOS transistors 413n1 and 413n2. N channel MOS transistors 413n1 and 413n2 are connected to output node N310 of Vbb generating circuits 310a and 310b instead of the ground potential node 100, so that the L level of the mode detection signal VBBFRC is converted from the ground potential Vss to Vbb potential VBBTMP. Inverter 414 includes a P channel MOS transistor 414p and an N channel MOS transistor 414n. Transistor 414n is connected to output node N310 of Vbb generating circuits 310a and 301b instead of ground potential node 1000. Inverter 415 includes a P channel MOS transistor 415p and an N channel MOS transistor 415n. Transistor 415n is connected to output node N310 of Vbb generating circuits 310a and 310b instead of ground potential node 1000.

In the FORCE generating circuit 410 structured as described above, when mode detection signal VBBFRC changes from the L level to the H level, selection control signal FORCEA changes from the L level to the H level, and selection control signal /FORCEA changes from the H level to the L level. Meanwhile, when mode detection signal VBBFRC changes from the H level to the L level, mode selection signal FORCEA changes from the H level to the L level, and selection control signal /FORCEA changes from the L to H level. The L levels of selection control signals FORCEA and /FORCEA are the same potential as Vbb potential VBBTMP.

The clock generating circuit 110 in FIG. 1 includes an output enable signal activating circuit 111 for internally generating an activated output enable signal /OE in the VbbFORCE mode as shown in FIG. 16. The output enable signal activating circuit 111 includes an N channel MOS transistor 112, a transmission gate 113 and an inverter 114. These selection control signals FORCEA and /FORCEA are used to control a /OE level transmitted to the clock generating circuit 110. As shown in FIG. 16, in a mode other than VbbFORCE mode, when selection control signal FORCEA is at the L level and selection control signal /FORCEA is at the H level, an output enable signal /OE given to output enable pin PO is transmitted into a clock generating circuit 110. In the VbbFORCE mode, when selection control signal FORCEA is at the H level and selection control signal /FORCEA is at the L level, a signal given to output enable pin PO is used as the external reference potential VBBOE and not transmitted into a clock generating circuit 110. In a clock generating circuit 110, the node N111 is fixed at the L level by a N channel transistor 112, which means that the clock generating circuit 110 understand that a signal from output enable pin PO is at L level. In this state, a DRAM can perform simple write/read operations.

Figure 18:
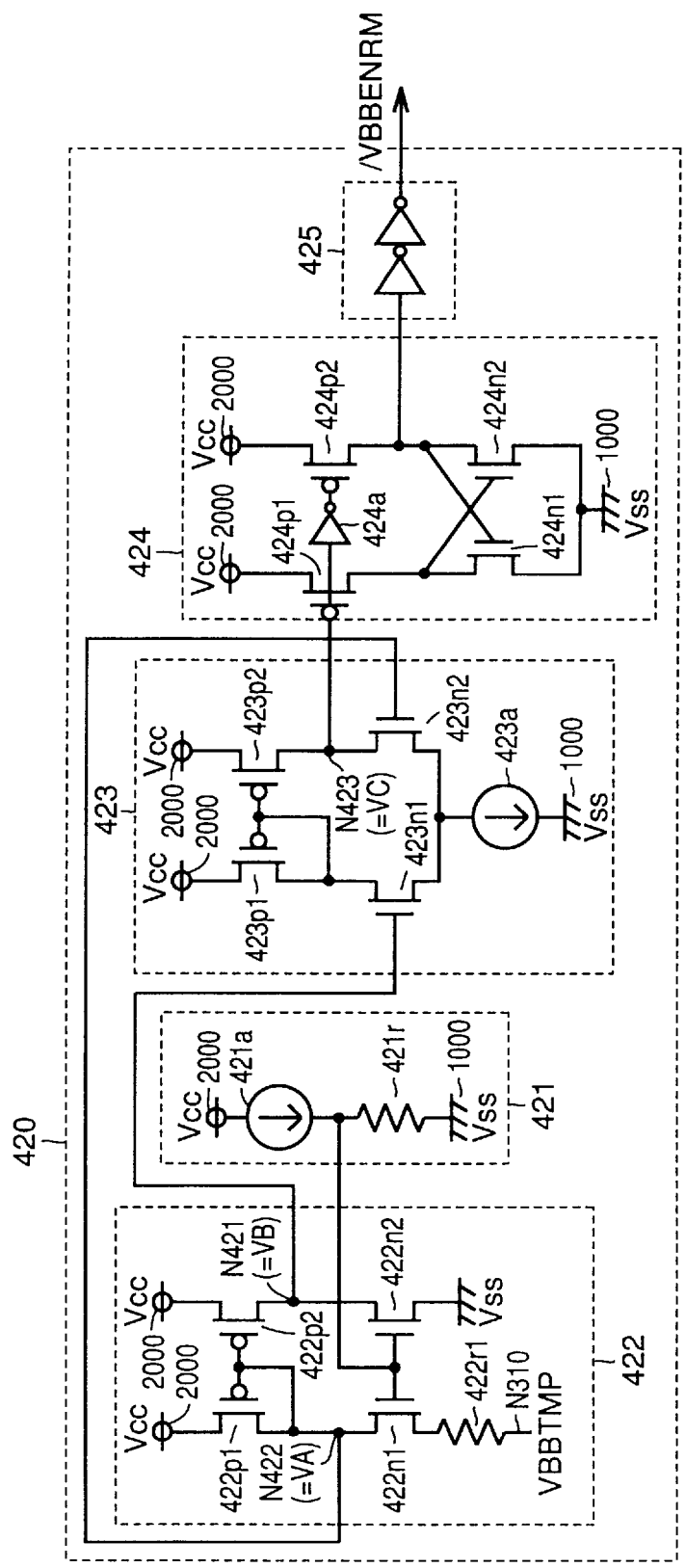
FIG. 18 is a circuit diagram showing a structure of a first detection circuit shown in FIG. 15.

The first detection circuit 420 shown in FIG. 15 includes, as shown in FIG. 18, a voltage dividing circuit 421 for outputting a predetermined potential to a node N421, a comparing circuit 422 for detecting whether the Vbb potential VBBTMP has reached a predetermined potential VBB0, a current mirror differential amplifying circuit 423 for amplifying a difference between a potential VB appearing at node N421 and a potential VA appearing at node N422, a level shift circuit 424 receiving an output signal from differential amplifying circuit 423, and a drive inverter 425 driving an output signal from level shift circuit 424. The voltage dividing circuit 421 includes a current source 421a and a resistance element 421r connected in series between power supply potential node 2000 and ground potential node 1000. Comparing circuit 422 includes P channel MOS transistors 422p1 and 422p2, N channel MOS transistors 422n1 and 422n2, and a resistance element 422r1. Transistors 422p2 and 422n2 are connected in series between power supply potential node 2000 and ground potential node 1000. Potential VB appears at node N421. Transistors 422p1 and 422n1 as well as resistance element 422r1 are connected in series between power supply potential node 2000 and output node N310 of Vbb generating circuits 310a and 310b. Potential VA appears at node N422. Transistors 422p1 and 422p2 have their gates both connected to node N422. Transistors 422n1 and 422n2 have their gates both connected to node N421. Differential amplifying circuit 423 includes P channel MOS transistors 423p1 and 423p2, N channel MOS transistors 423n1 and 423n2, and a current source 423a. Level shift circuit 424 includes P channel MOS transistors 424p1 and 424p2, N channel MOS transistors 424n1 and 424n2, and an inverter 424a.

Figure 19:
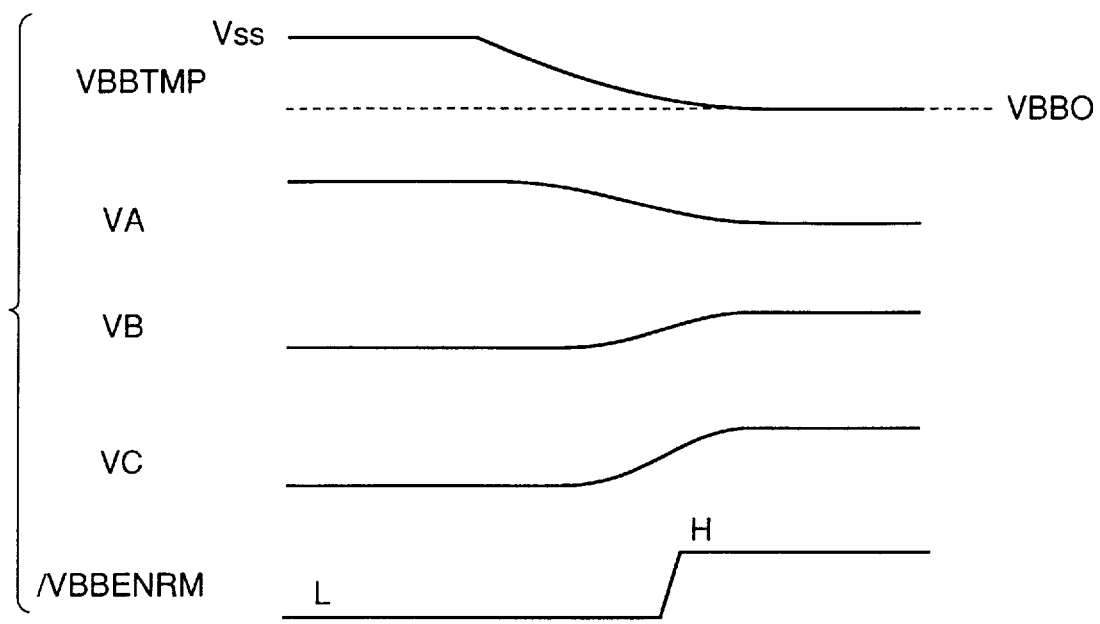
FIG. 19 is a timing chart showing the operation of the first detection circuit of FIG. 18.

Referring to the timing chart of FIG. 19, when Vbb potential VBBTMP is equal to the ground potential Vss, transistor 422n1 is connected to resistance element 422r1, and therefore, gate-source voltage of transistor 422n2 is higher than that of transistor 422n1. Therefore, conduction resistance of transistor 422n2 becomes smaller than that of transistor 422n1, and potential VA at node N422 becomes higher than the potential VB of node N421. When differential amplifying circuit 423 amplifies difference between potential VB at node N421 and potential VA at node N422, the potential VC at output node N423 of differential amplifying circuit 423 changes to the L level, and the potential control signal /VBBENRM which has been converted from an analog to digital signal by level shift circuit 424 and drive inverter 425 changes to the L level.

Thereafter, when Vbb potential VBBTMP lowers, the gate-source voltage of transistor 422n1 becomes larger than that of transistor 422n2, and conduction resistance of transistor 422n1 becomes smaller than that of transistor 422n2. Therefore, the potential VBB at node N421 rises toward the H level, while the potential VA at node N422 lowers toward the L level. In accordance with this change in potentials, the potential VC at output node N423 of differential amplifying circuit 423 rises towards the H level. As a result, the potential control signal /VBBENRM which has been converted from analog to digital signal by level shift circuit 424 and drive inverter 425 changes from the L to H level.

Figure 20:
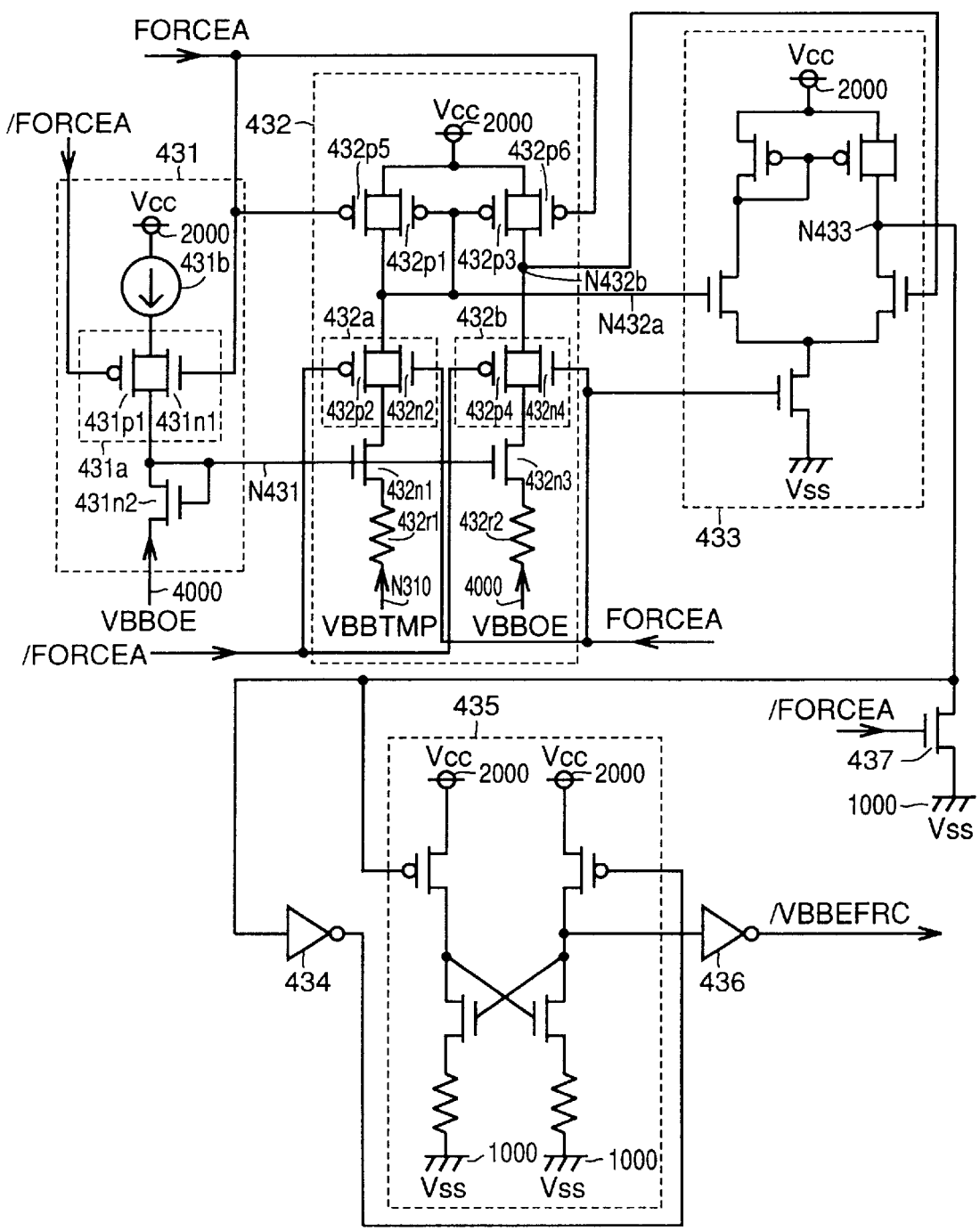
FIG. 20 is a circuit diagram showing a structure of a second detection circuit shown in FIG. 15.
Figure 21:
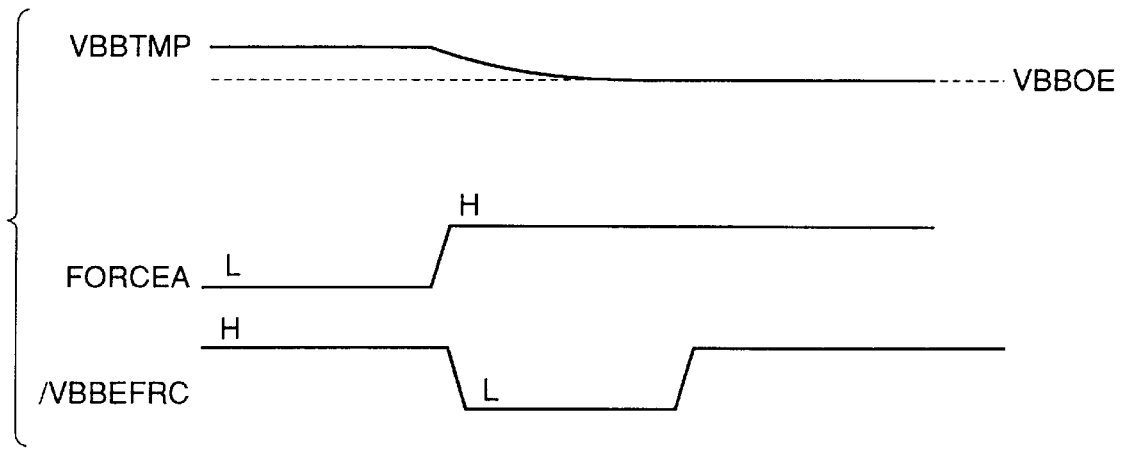
FIG. 21 is a timing chart showing the operation of the second detection circuit of FIG. 20.

The second detection circuit 430 of FIG. 15 includes, as shown in FIG. 20, a voltage dividing circuit 431, a comparing circuit 432, a current mirror differential amplifying circuit 433, inverters 434 and 436, a level shift circuit 435 and N channel MOS transistor 437.

Voltage dividing circuit 431 includes a current source 431b, a transmission gate 431a which turns on when the selection control signal FORCEA is at H level and selection control signal /FORCEA is at L level, and an N channel MOS transistor 431n2 connected between transmission gate 431a and a reference potential node 4000 which receives an external reference potential VBBOE. Transmission gate 431a includes a P channel MOS transistor 431p1 and an N channel MOS transistor 431n1.

Comparing circuit 432 includes a p channel MOS transistor 432p1 connected between power supply potential node 2000 and a first comparing node N432a, a transmission gate 432a connected in series with transistor 432p1, an n channel MOS transistor 432n1 connected in series with transmission gate 432a, a resistance element (load element) 432r1 connected between transistor 432n1 and output node N310 of VBB generating circuits 310a and 310b, a P channel MOS transistor 432p3 connected between power supply potential node 2000 and a second comparing node N432b, a transmission gate 432b connected in series with transistor 432p3, an n channel MOS transistor 432n3 connected in series with transmission gate 432b, and a resistance element (load element) 432r2 connected between transistor 432n3 and a reference potential node 4000 to which an external reference potential VBBOE is supplied. Transistors 432p1 and 432p3 have their gates both connected to the first comparing node N432a. Therefore, transistors 432p1 and 432p3 constitute a current mirror circuit.

Transmission gate 432a includes a p channel MOS transistor 432p2 and an N channel MOS transistor 432n2, and it turns on when selection control signal FORCEA is at the H level and the selection control signal /FORCEA is at the L level. Transmission gate 432b includes a P channel MOS transistor 432p4 and an N channel MOS transistor 432n4, and it turns on when selection control signal FORCEA is at the H level and selection control signal /FORCEA is at the L level.

Comparing circuit 432 further includes a P channel MOS transistor 432p5 connected in parallel with transistor 432p1, and a p channel MOS transistor 432p6 connected in parallel with transistor 432p3. Transistors 432p5 and 432p6 turn off when selection control signal FORCEA is at the H level.

Differential amplifying circuit 433 amplifies a potential difference appearing between the first comparing node N432a and the second comparing node N432b. Transistor 437 turns on when selection control signal /FORCEA is at the H level, so as to cause a potential at output node N433 of differential amplifying circuit 433 to be equal to the ground potential Vss. Differential amplifying circuit 433, inverters 434 and 436 and level shift circuit 435 are driving circuits for generating a detection signal /VBBEFRC in response to a potential difference between the first and second comparing nodes N432a and N432b.

In the second detection circuit 430, as shown in the timing chart of FIG. 20, when external reference potential VBBOE is lower (deeper) than Vbb potential VBBTMP, the gate-source voltage of transistor 432n3 is higher than that of transistor 432n1, and hence conduction resistance of transistor 432n3 becomes smaller than that of transistor 432n1. Therefore, the potential of the second comparing node N432b becomes lower than that of the first comparing node N432a. Since differential amplifying circuit 433 amplifies potential difference between the first and second comparing nodes N432a and N432b, the potential at output node N433 of differential amplifying circuit 433 changes to the L level, and potential control signal /VBBEFR changes to and stabilized at the L level.

Figure 22:
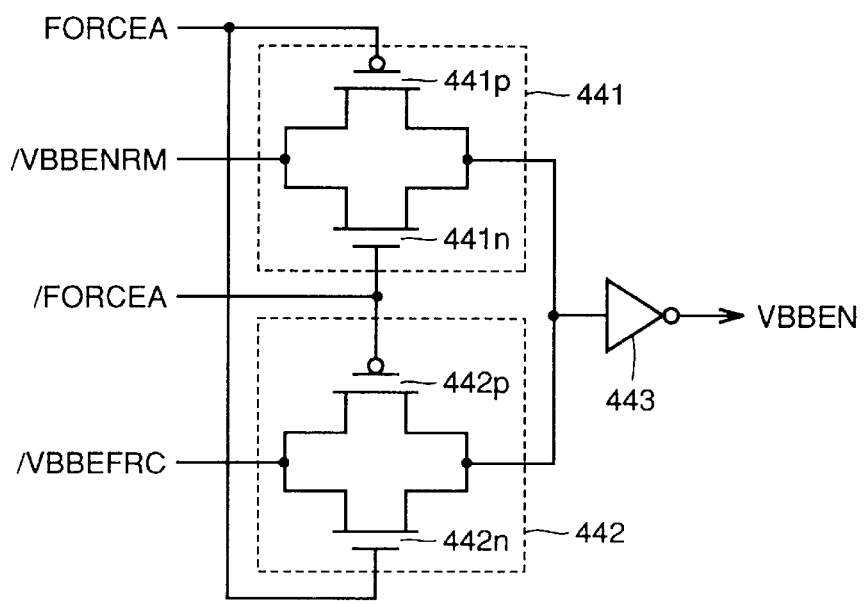
FIG. 22 is a circuit diagram showing the structure of a selection circuit shown in FIG. 15.

Selection circuit 440 of FIG. 15 includes, as shown in FIG. 22, a transmission gate 441 for transferring detection signal /VBBENRM from the first detection circuit 420, a transmission gate 442 for transferring detection signal /VBBEFRC from the second detection circuit 430, and an inverter 443 for inverting an output signal of transmission gate 441 or 442 for outputting potential control signal VBBEN. Transmission gate 441 is constituted by a P channel MOS transistor 441p and an N channel MOS transistor 441n, and it turns on when selection control signal FORCEA is at L level and selection control signal /FORCEA is at the H level. Transmission gate 442 is constituted by a P channel MOS transistor 442p and an N channel MOS transistor 442n, and it turns on when selection control signal FORCEA is at the H level and selection control signal /FORCEA is at the L level.

The operation of the DRAM structured as above will be described in the following with reference to the timing chart of FIG. 23. Row address strobe signal /RAS changes as shown in (a) of FIG. 23. Column address strobe signal /CAS changes as shown in (b) of FIG. 23. Write enable signal /WE changes as shown in (c) of FIG. 23. Output enable signal /OE changes as shown in (d) of FIG. 23. Address signal A0 changes as shown in (e) of FIG. 23. Address signal A1 changes as shown in (f) of FIG. 23. /RAS, /CAS, /WE, /OE, A0 and A1 are externally applied external input signals.

Figure 23:
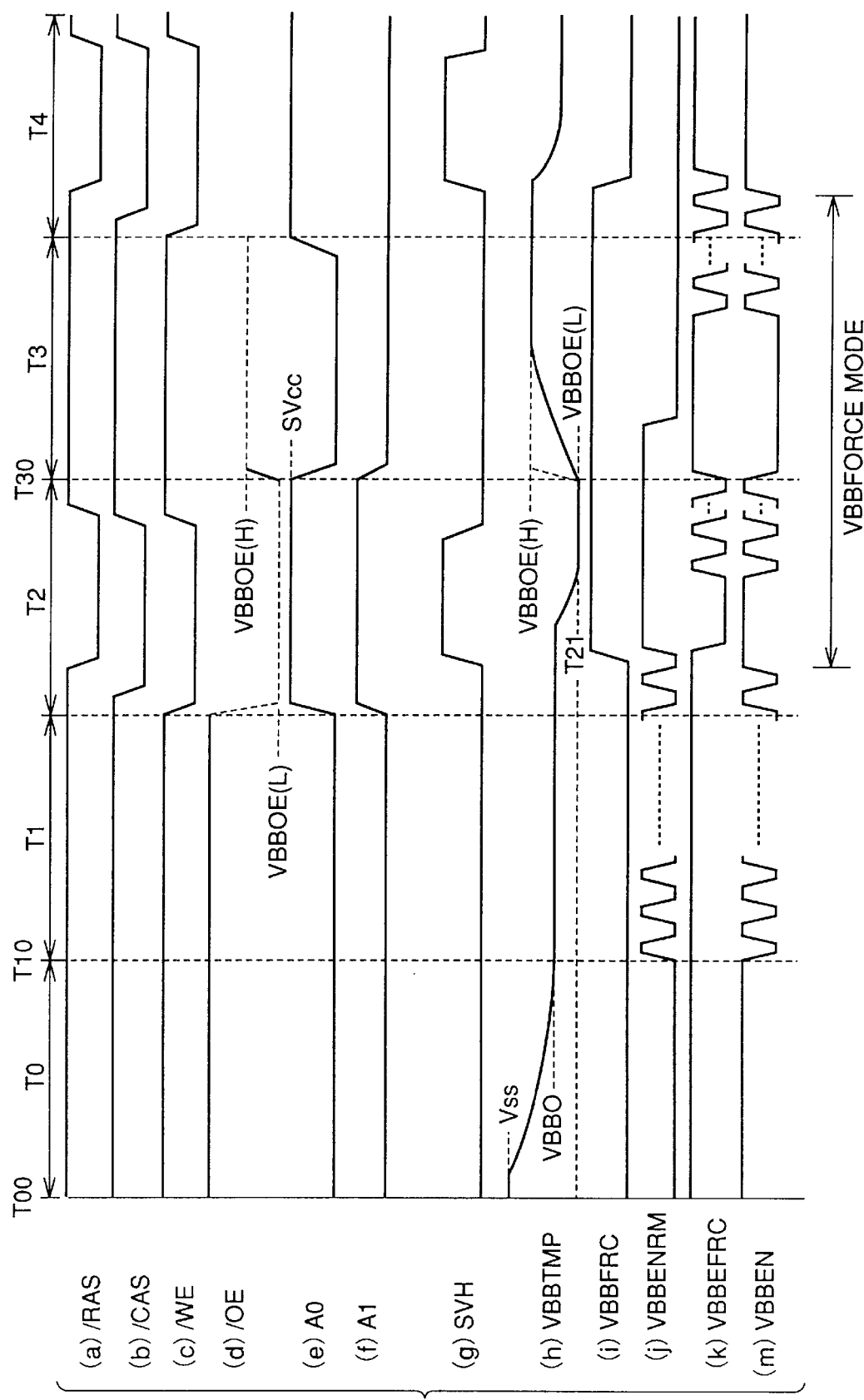
FIG. 23 is a timing chart showing the operation of the DRAM of FIG. 1.

Test mode reception signal SVH changes as shown in (g) of FIG. 23. Vbb potential VBBTMP changes as shown in (h)

of FIG. 23. Mode detection signal VBBFRC changes as shown in (i) of FIG. 23. Detection signal /VBBENRM from the first detection circuit 420 changes as shown in (j) of FIG. 23. Detection signal /VBBEFRC from the second detection circuit 430 changes as shown in (k) of FIG. 23. Potential control signal VBBEN changes as shown in (m) of FIG. 23. SVH, VBBTMP, VBBFRC, /VBBENRM, /VBBEFRC and VBBEN are signals internally generated in response to the external input signals shown in (a) to (f) of FIG. 23.

In a time period T0 from power on of the DRAM 100 until Vbb potential VBBTMP attains to and is stabilized at potential VBB0, when power is turned on at T00, Vbb potential VBBTMP is at the ground potential Vss. Therefore, conduction resistance of transistor 422n2 in comparing circuit 422 of the first detection circuit 420 shown in FIG. 18 becomes smaller than that of transistor 422n1. Accordingly, detection signals /VBBENRM from the first detection circuit 420 is activated to the L level. In response to the L level detection signal /VBBENRM, selection circuit 440 activates potential control signal VBBEN to the H level. In response to the H level potential control signal VBBEN, Vbb generating circuits 310a and 310b are activated, and Vbb potential is supplied to output node 310. Therefore, Vbb potential VBBTMP lowers toward potential VBB0.

Thereafter, when Vbb potential VBBTMP attains to the potential VBB0 at time T10, conductive resistance of transistor 422n1 of comparing circuit 422 of the first detection circuit 420 becomes smaller than that of transistor 422n2. Therefore, detection signal /VBBENRM from the first detection circuit 420 is inactivated to the H level. In response to the H level detection signal /VBBENRM, selection circuit 440 inactivates potential control signal VBBEN to L level. In response to the L level potential control signal VBBEN, Vbb generating circuits 310a and 310b are inactivated, and supply of the Vbb potential is stopped. Therefore, lowering of Vbb potential VBBTMP stops.

Figure 24:
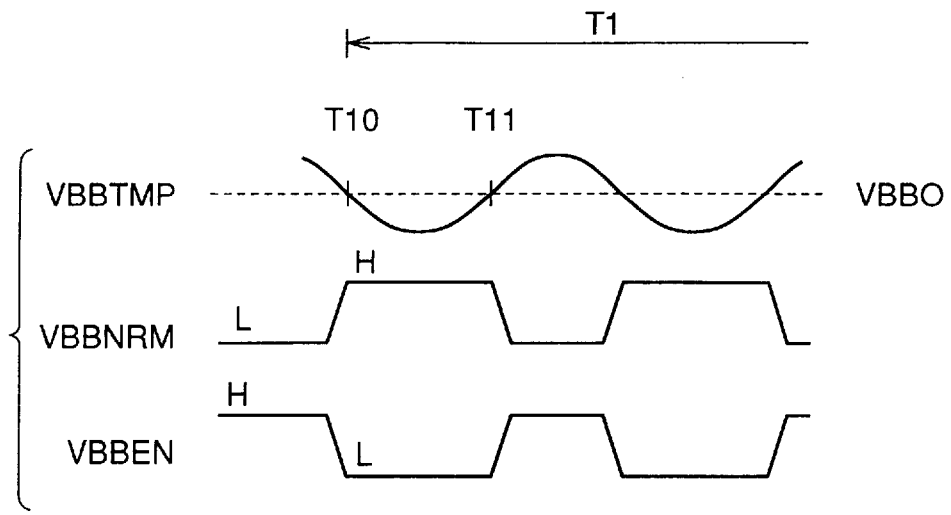
FIG. 24 is a timing chart showing the operation in a time period T1 of FIG. 23.

In a period T1 in which Vbb potential VBBTMP is stable in FIG. 23, Vbb potential VBBTMP slightly changes near the potential VBB0 as shown in FIG. 24. When Vbb potential VBBTMP attains to the potential VBB0 at time T10 and further becomes lower (deeper) than potential VBB0, potential control signal VBBEN is inactivated to the L level, and supply of internal potential Vbb in Vbb generating circuits 310a and 310b is stopped. When supply of Vbb potential is stopped, Vbb potential VBBTMP gradually rises, reaches the potential VBB0 at time T11, and becomes higher (shallower) than the potential VBB0. Therefore, potential control signal VBBEN is activated to the H level, and supply of Vbb potential in Vbb generating circuits 310a and 310b is resumed. The above described operation is repeated, and Vbb potential VBBTMP slightly fluctuates near the potential VBB0.

Thereafter, in period T2, the DRAM enters the VbbFORCE mode. When row address strobe signal /RAS, column address strobe signal /CAS and write enable signal /WE are applied at a predetermined WCBR timing and high potential SVcc is applied to address pin PA0, test mode entry detection circuit 210 shown in FIG. 2 outputs a test mode reception signal SVA at the H level, indicating that it is a period for receiving test mode. At this time, when an address signal A1 at the H level is applied, test mode generating circuit 290 shown in FIG. 2 changes the mode detection signal VBBFRC to the H level. Consequently, DRAM enters VbbFORCE mode. When the DRAM enters the VbbFORCE mode, the second detection circuit 430 shown in FIG. 15 is activated, detection signal /VBBEFRC from the second detection circuit 430 is output as potential control signal VBBEN instead of the detection signal /VBBENRM from the first detection circuit 420, and in response to the potential control signal VBBEN, Vbb generating circuits 310a and 310b are controlled.

First, in a period T2 in which external reference potential VBBOE (L) applied from output enable pin PO is lower (deeper) than VBBREF, when mode detection signal VBBFRC changes from the L to the H level at time T21, the second detection circuit 430 is activated. The Vbb potential VBBTMP appearing at output node N310 in the second detection circuit 430 shown in FIG. 20 is compared with the external reference potential VBBOE (L) appearing at external reference potential node 400 by comparing circuit 432. In period T2, external reference potential VBBOE (L) is lower than the internal reference potential VBBREF, and therefore the potential appearing at the first comparing node N432a is higher than the potential appearing at the second comparing node N432b of comparing circuit 432. Differential amplifying circuit 433 amplifies the potential difference, and detection signal /VBBEFRC from the second detection circuit 430 is activated to the L level. At this time, since the DRAM is in the VbbFORCE mode, selection circuit 440 activates the potential control signal VBBEN in response to the H level detection signal /VBBEFRC which is at the H level. Vbb generating circuits 310a and 310b are activated in response to the H level potential control signal VBBEN, and supply the Vbb potential to output node N310. Therefore, Vbb potential VBBTMP lowers until it reaches the external reference potential VBBOE (L). When Vbb potential VBBTMP attains to the external reference potential VBBOE (L), Vbb potential VBBTMP becomes stable at external reference potential VBBOE (L) as in the above described period T1.

Meanwhile, in period T3 in which external reference potential VBBOE (H) applied from output enable pin PO is higher than the potential VBB0, when external reference potential VBBOE (H) becomes higher as shown by the dotted lines in (d) and (h) of FIG. 23 at time T3, the potential appearing at the first comparing node N432a becomes lower than the potential appearing at the second comparing node N432b of comparing circuit 432 in the second detection circuit 430. The potential difference is amplified by differential amplifying circuit 433, and detection signal /VBBEFRC from the second detection circuit 430 is inactivated to the H level. At this time, since DRAM is in the VbbFORCE mode, selection circuit 440 inactivates the potential control signal VBBEN to the L level in response to the detection signal /VBBEFRC which is at the H level. Therefore, Vbb generating circuits 310a and 310b are inactivated, and supply of the Vbb potential is stopped. Vbb potential VBBTEMP rises toward the external reference potential VBBOE (H), and when it reaches the external reference potential VBBOE (H), Vbb potential VBBTMP becomes stable near the external reference potential VBBOE (H), as in the period T3.

Thereafter, as can be seen in period T4, when row address strobe signal /RAS, column address strobe signal /CAS and write enable signal /WE are applied at the WCBR timing, high potential SVcc is applied to address pin PA0 and address signal A1 at the L level is applied, VbbFORCE mode is reset.

According to the above described embodiment, when mode detection signal VBBFRC is at the H level indicating the VbbFORCE mode, when Vbb potential has not yet reached the external reference potential VBBOE, the potential control signal VBBEN is activated, and therefore Vbb potential can be controlled in accordance with the external reference potential VBBOE.

Figure 25:
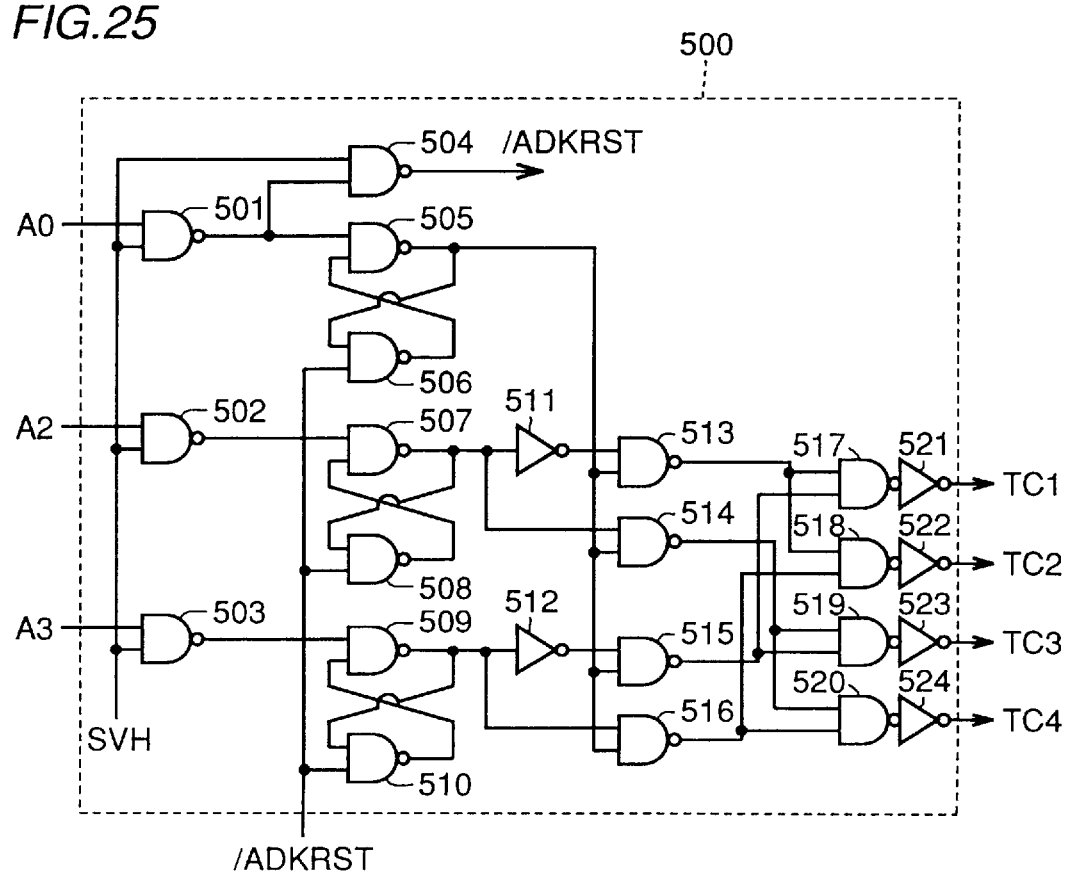
FIG. 25 is a circuit diagram showing another structure of a test mode generating circuit shown in FIG. 2.
Figure 26:
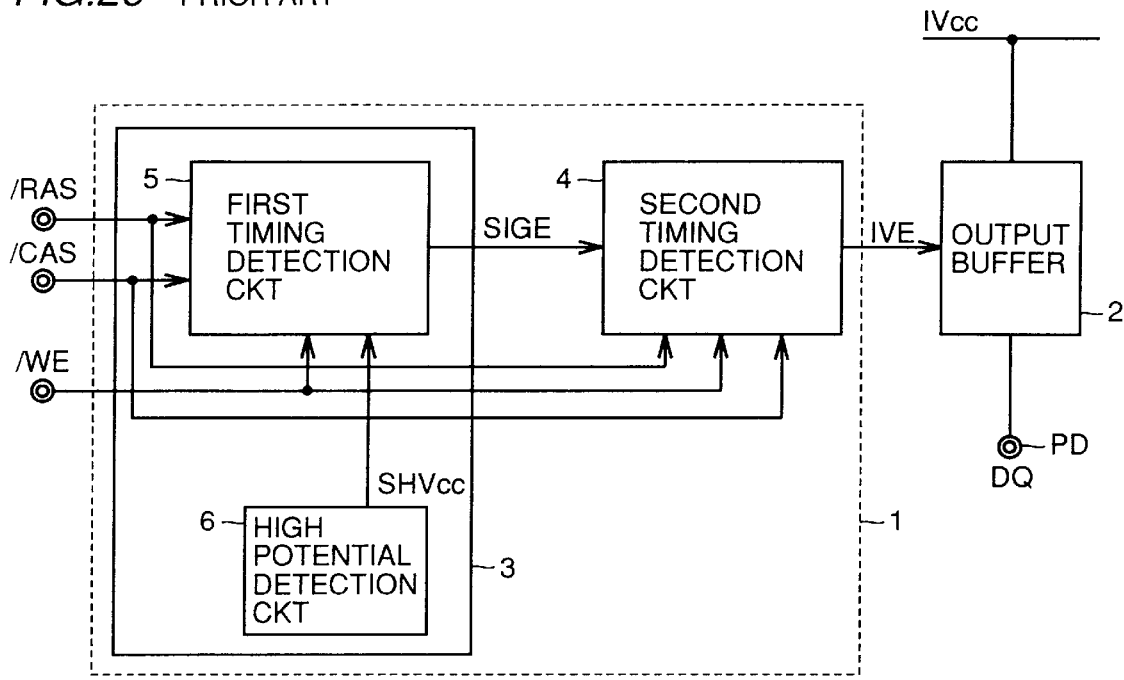
FIG. 26 is a block diagram showing a structure of a monitor circuit in a conventional semiconductor device.
Figure 27:
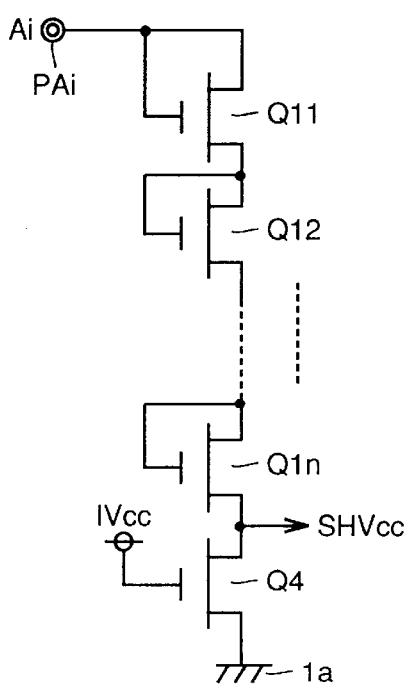
FIG. 27 is a circuit diagram showing the structure of a high potential detection circuit shown in FIG. 26.
Figure 28:
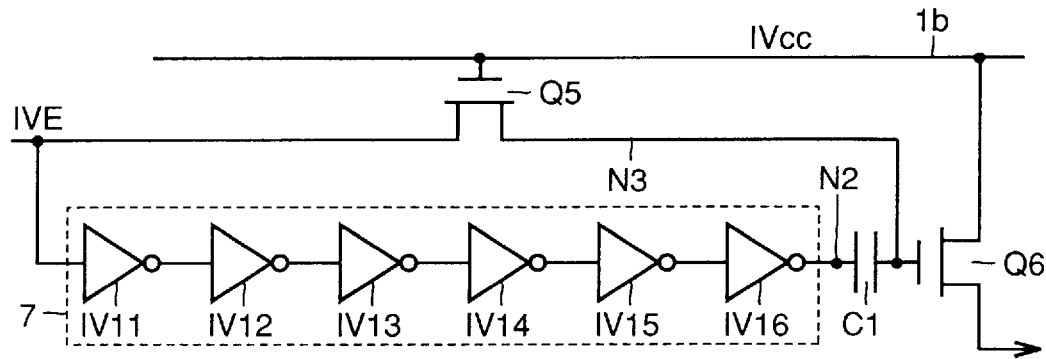
FIG. 28 is a circuit diagram showing the structure of the output buffer shown in FIG. 26.
Figure 29:
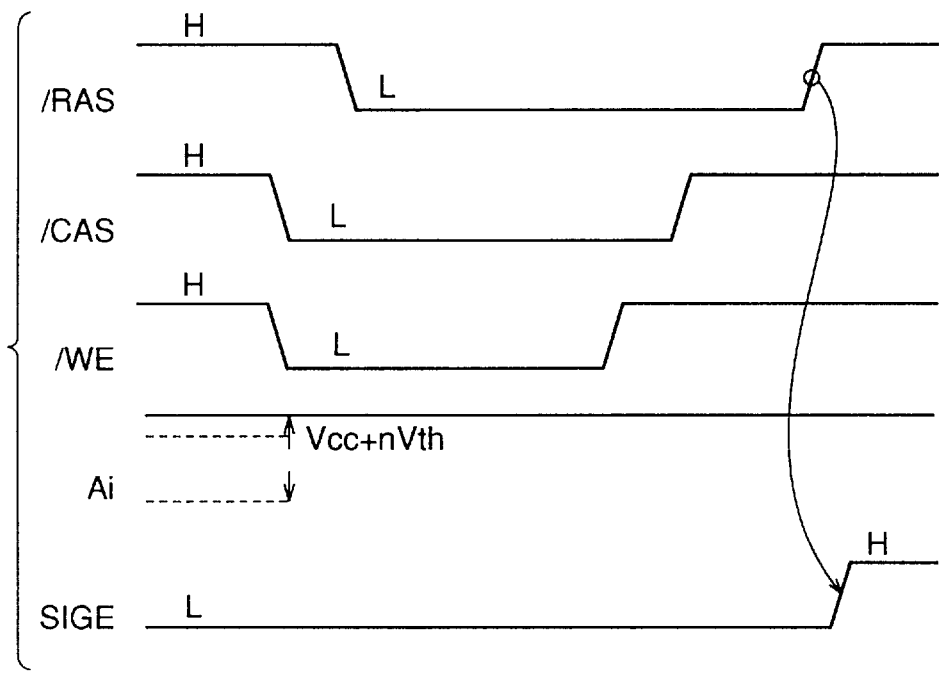
FIG. 29 is a timing chart showing the operation of a signature mode signal generating circuit shown in FIG. 26.
Figure 30:
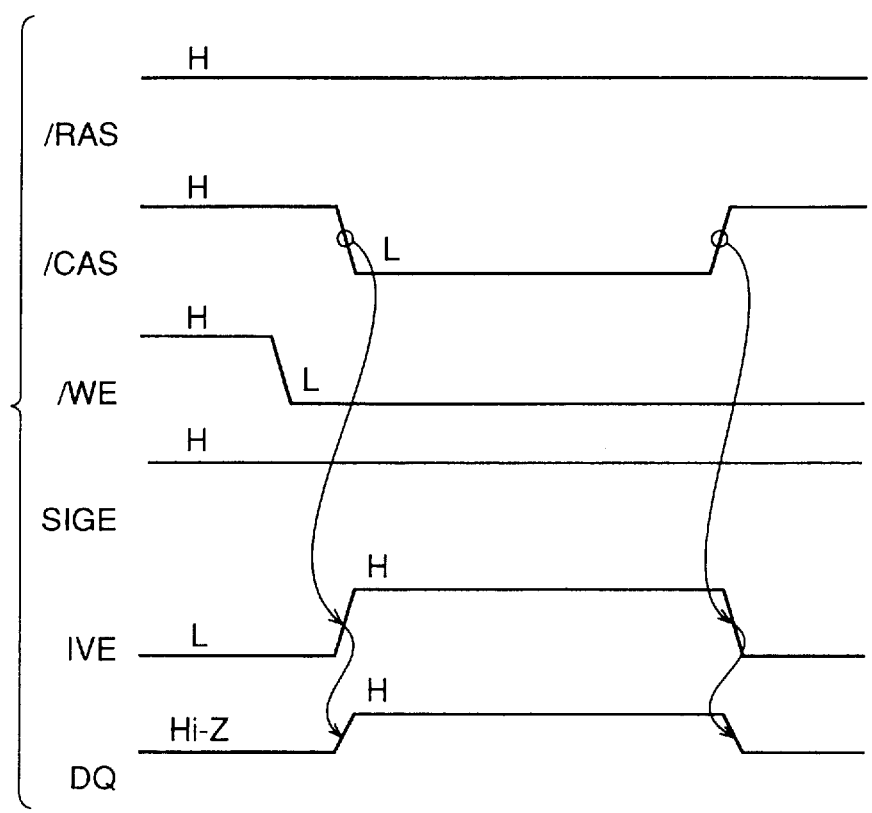
FIG. 30 is a timing chart showing the operation of the monitor circuit shown in FIG. 26.

In the above embodiment, VbbFORCE mode in which Vbb potential is controlled by the external reference potential VBBOE has been described. However, the present invention is applicable not only to the Vbb generating circuit but also to a Vpp generating circuit, an internal power supply potential (IVcc) generating circuit, boosted ground potential generating circuit in a boosted sense ground method, and so on. In the above described embodiment, the external reference potential VBBOE is supplied to output enable pin PO. However, it may be applied to other pin. In the above described embodiment, the external reference potential VBBOE is directly supplied to the second detection circuit 430. However, it may be supplied after it is divided by a resistance division, for example. Instead of the test mode generating circuit 290 shown in FIG. 11, test mode generating circuit shown in FIG. 25 may be used. Test mode generating circuit 500 includes NAND circuits 501 to 510 and 513 to 520, and inverters 511, 512, 521 to 524. Test mode generating circuit 500 decodes address signals A0, A2 and A3, and generates mode detection signals TC1 to TC4 for selecting four different test modes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a mode detection circuit responsive to an external input signal for generating a mode detection signal selectively indicating first and second modes;

an output node;

an internal potential generating circuit responsive to an activated potential control signal for generating an internal potential and supplying the generated internal potential to said output node, and responsive to an inactivated potential control signal, for stopping generation of said internal potential; and an internal potential control circuit for activating said potential control signal when potential at said output node has not yet reached a predetermined internal reference potential in a first case in which said mode detection signal indicates the first mode, and for activating said potential control signal when potential at said output node has not yet reached an externally supplied external reference potential or a potential responsive to said external reference potential in a second case in which said mode detection signal indicates a second mode.

2. The semiconductor device according to claim 1, wherein said internal potential control circuit includes a first detection circuit for generating an activated first detection signal when the potential at said output node has not yet reached said internal reference potential, a second detection circuit for generating an activated second detection signal when the potential at said output node has not yet reached said external reference potential, and a selecting circuit for activating said potential control signal in response to said activated first detection signal in said first case, and for activating said potential control signal in response to said activated second detection signal in said second case.

3. The semiconductor device according to claim 2, wherein said second detection circuit includes a first comparing node, a first current mirror element connected between a power supply potential node to which a power supply potential is supplied and said first comparing node, a first switching element connected in series with said first current mirror element and being turned off in said first case, a first load element connected between said first comparing node and said output node, a second comparing node, a second current mirror element connected between said power supply potential node and said second comparing node, constituting a current mirror circuit together with said first current mirror element, a second switching element connected in series with said second current mirror element and being turned off in said first case, a second load element connected between said second comparing node and a reference potential node to which said external reference potential is supplied, and a driving circuit for generating said second detection signal in response to potential difference between said first and second comparing nodes.

4. The semiconductor device according to claim 1, wherein said internal potential is one of a substrate potential and a boosted potential.

\* \* \* \* \*